(12) United States Patent
Mui et al.

(10) Patent No.: US 9,330,779 B2
(45) Date of Patent: May 3, 2016

(54) DETECTING PROGRAMMED WORD LINES BASED ON NAND STRING CURRENT

(71) Applicant: SanDisk Technologies Inc., Plano, TX (US)

(72) Inventors: Man L Mui, Santa Clara, CA (US); Yingda Dong, San Jose, CA (US); Chris Avila, Sunnyvale, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/594,473

(22) Filed: Jan. 12, 2015

(65) Prior Publication Data

US 2015/0124527 A1      May 7, 2015

Related U.S. Application Data

(63) Continuation of application No. 13/932,384, filed on Jul. 1, 2013, now Pat. No. 8,964,480.

(51) Int. Cl.

| | |
|---|---|
| *G11C 11/34* | (2006.01) |
| *G11C 16/34* | (2006.01) |
| *G11C 16/26* | (2006.01) |
| *G11C 13/00* | (2006.01) |
| *G11C 11/56* | (2006.01) |

(52) U.S. Cl.
CPC ........ *G11C 16/3459* (2013.01); *G11C 11/5635* (2013.01); *G11C 11/5642* (2013.01); *G11C 13/004* (2013.01); *G11C 16/26* (2013.01); *G11C 16/344* (2013.01); *G11C 16/3454* (2013.01)

(58) Field of Classification Search
CPC ............... G11C 11/5642; G11C 16/26; G11C 2211/5634; G11C 13/004; G11C 16/3459; G11C 29/12005; G11C 16/24; G11C 2013/0054; G11C 2013/0057; G11C 2029/5006; G09G 3/325
USPC ............... 365/185.05, 185.17, 185.18, 185.2, 365/185.21, 185.22, 185.23, 185.24, 365/185.27, 185.29
See application file for complete search history.

(56) References Cited

U.S. PATENT DOCUMENTS

| | | | |
|---|---|---|---|
| 6,928,001 | B2 | 8/2005 | Avni et al. |
| 7,471,567 | B1 | 12/2008 | Lee et al. |
| 7,545,678 | B2 | 6/2009 | Lee et al. |

(Continued)

OTHER PUBLICATIONS

International Search Report & The Written Opinion of the International Searching Authority dated Oct. 29, 2014, International Application No. PCT/US2014/044953.

(Continued)

*Primary Examiner* — Fernando Hidalgo
(74) *Attorney, Agent, or Firm* — Vierra Magen Marcus LLP

(57) ABSTRACT

A number (Nwl) of programmed word lines in a block of NAND strings is determined by measuring a reference combined current (Iref) in the block when all of the memory cells are in a conductive state. Subsequently, to determine if a word line is a programmed word line, an additional combined current (Iadd) in the block is measured with a demarcation voltage applied to the selected word line. The selected word line is determined to be programmed word lines if Idd is less than Iref by at least a margin. Nwl can be used to adjust an erase-verify test of an erase operation by making the erase-verify test relatively hard to pass when the number is relatively small and relatively easy to pass when the number is relatively large. Or, Nwl can be used to identify a next word line to program in the block.

20 Claims, 18 Drawing Sheets

(56) References Cited

U.S. PATENT DOCUMENTS

| | | | |
|---|---|---|---|
| 7,606,076 B2 | 10/2009 | Nguyen et al. | |
| 7,613,045 B2 | 11/2009 | Murin et al. | |
| 7,660,162 B2 | 2/2010 | Cho | |
| 8,073,648 B2 | 12/2011 | Shlick et al. | |
| 8,737,139 B2 | 5/2014 | Moschiano et al. | |
| 8,745,355 B2 | 6/2014 | Norman et al. | |
| 8,787,088 B2 | 7/2014 | Dutta et al. | |
| 8,797,805 B2 | 8/2014 | Shen | |
| 8,976,598 B2 * | 3/2015 | Kim | G11C 11/5642 365/148 |
| 2009/0135646 A1 | 5/2009 | Murin et al. | |
| 2009/0296475 A1 | 12/2009 | Hemink et al. | |
| 2011/0261626 A1 * | 10/2011 | Kim | G11C 11/5642 365/185.22 |
| 2013/0028021 A1 | 1/2013 | Sharon et al. | |
| 2015/0003162 A1 | 1/2015 | Mui et al. | |

OTHER PUBLICATIONS

Restriction Requirement dated Oct. 31, 2014, U.S. Appl. No. 13/932,384, filed Jul. 1, 2013.

Notice of Allowance dated Nov. 26, 2014, U.S. Appl. No. 13/932,384, filed Jul. 1, 2013.

* cited by examiner

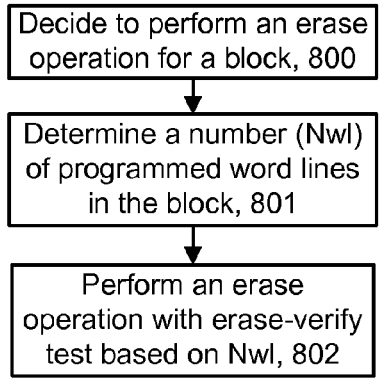
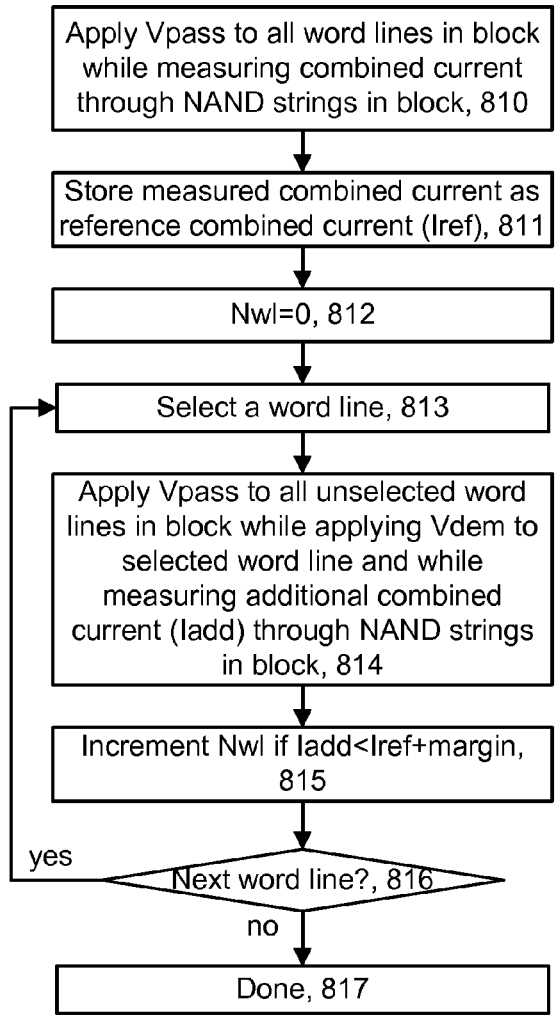

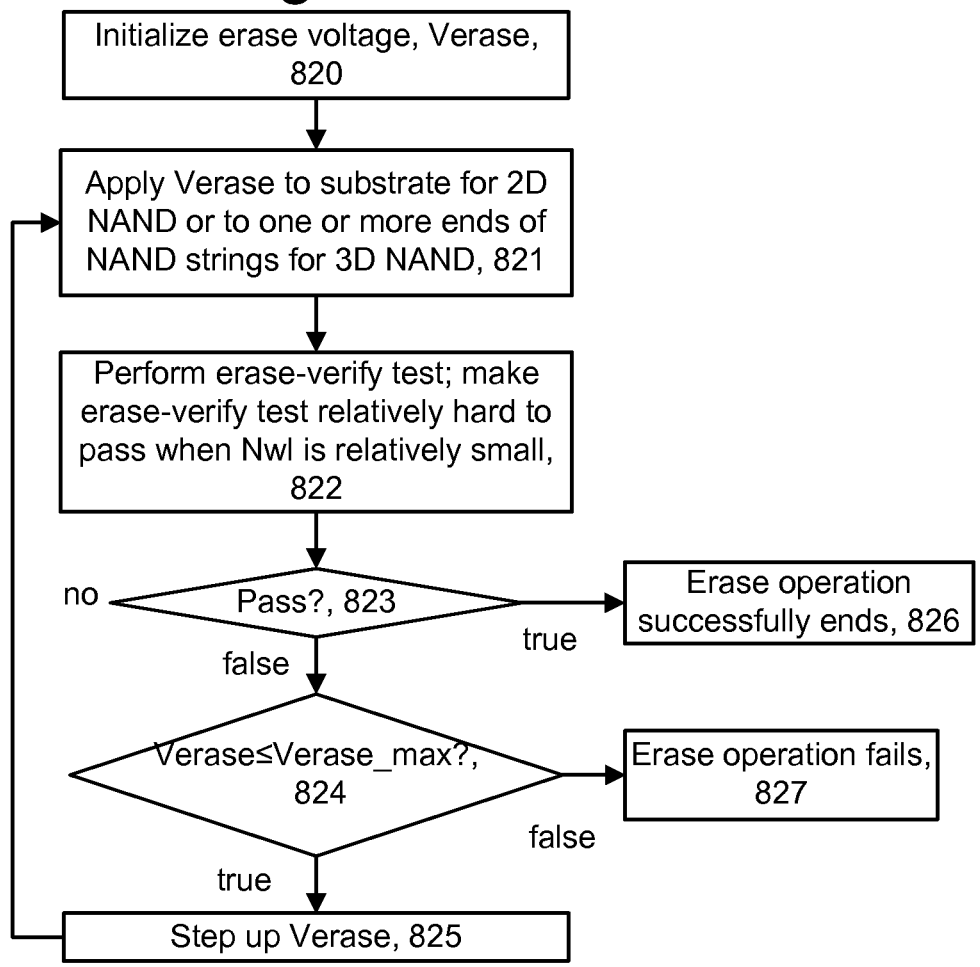

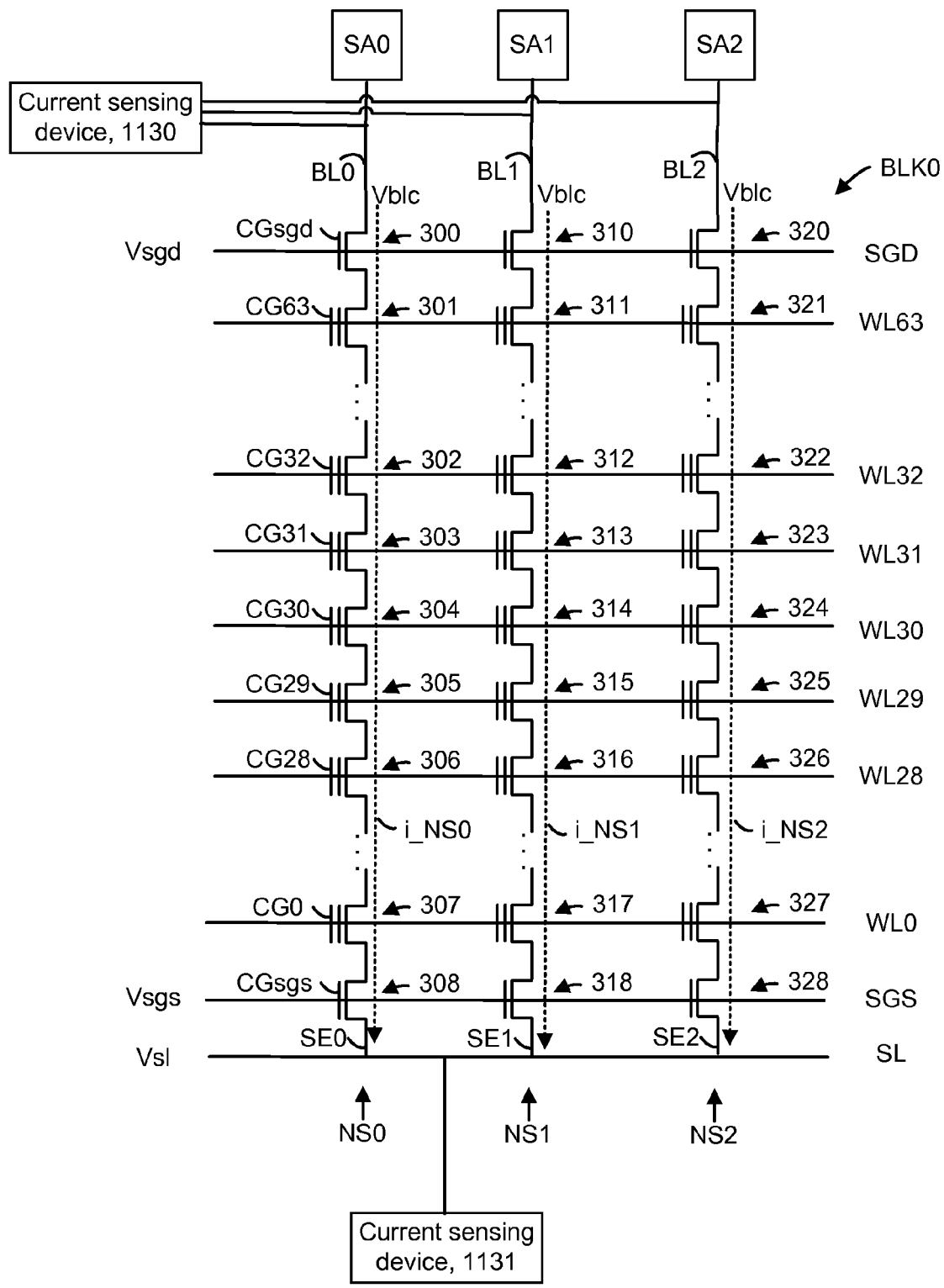

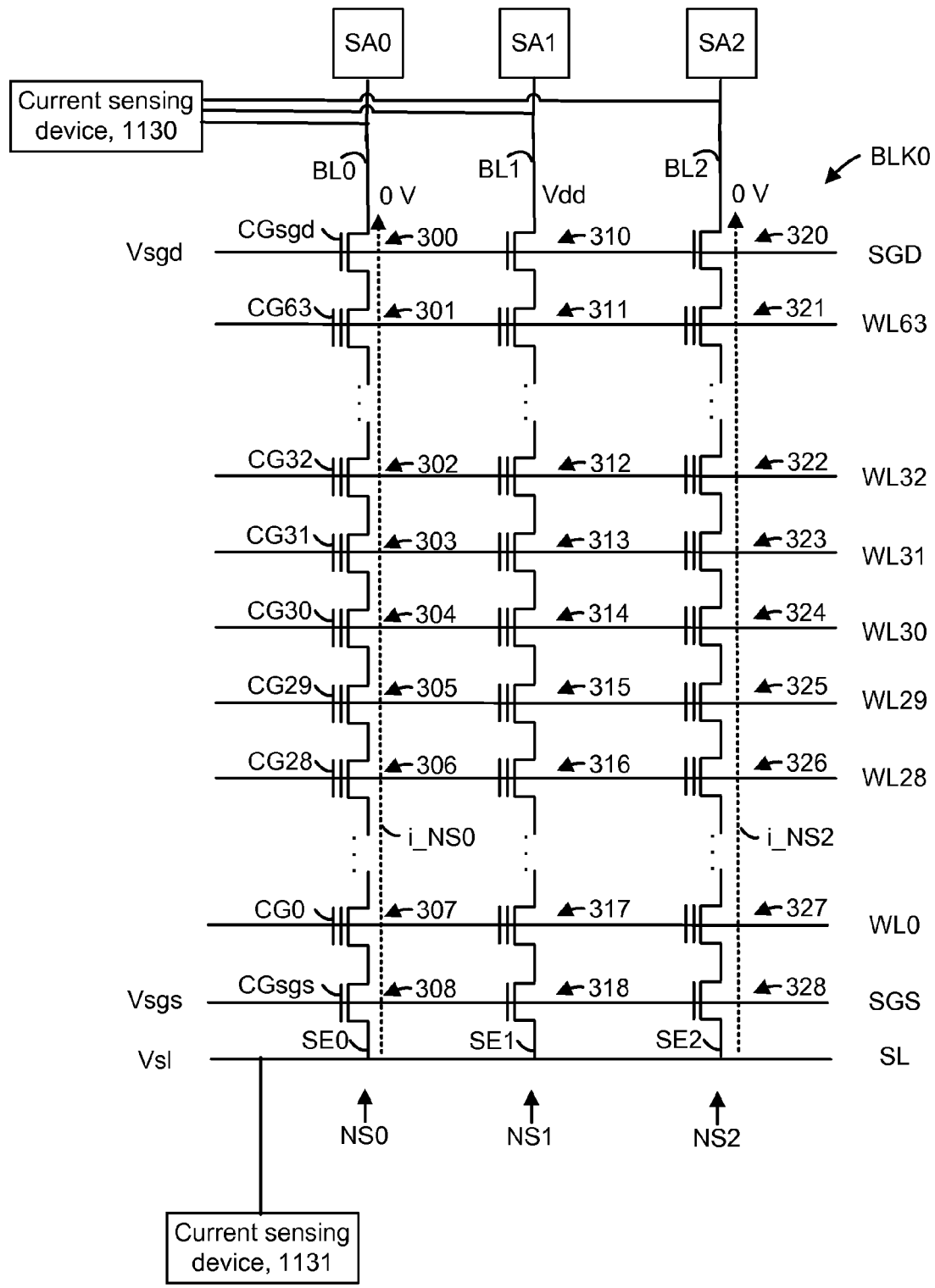

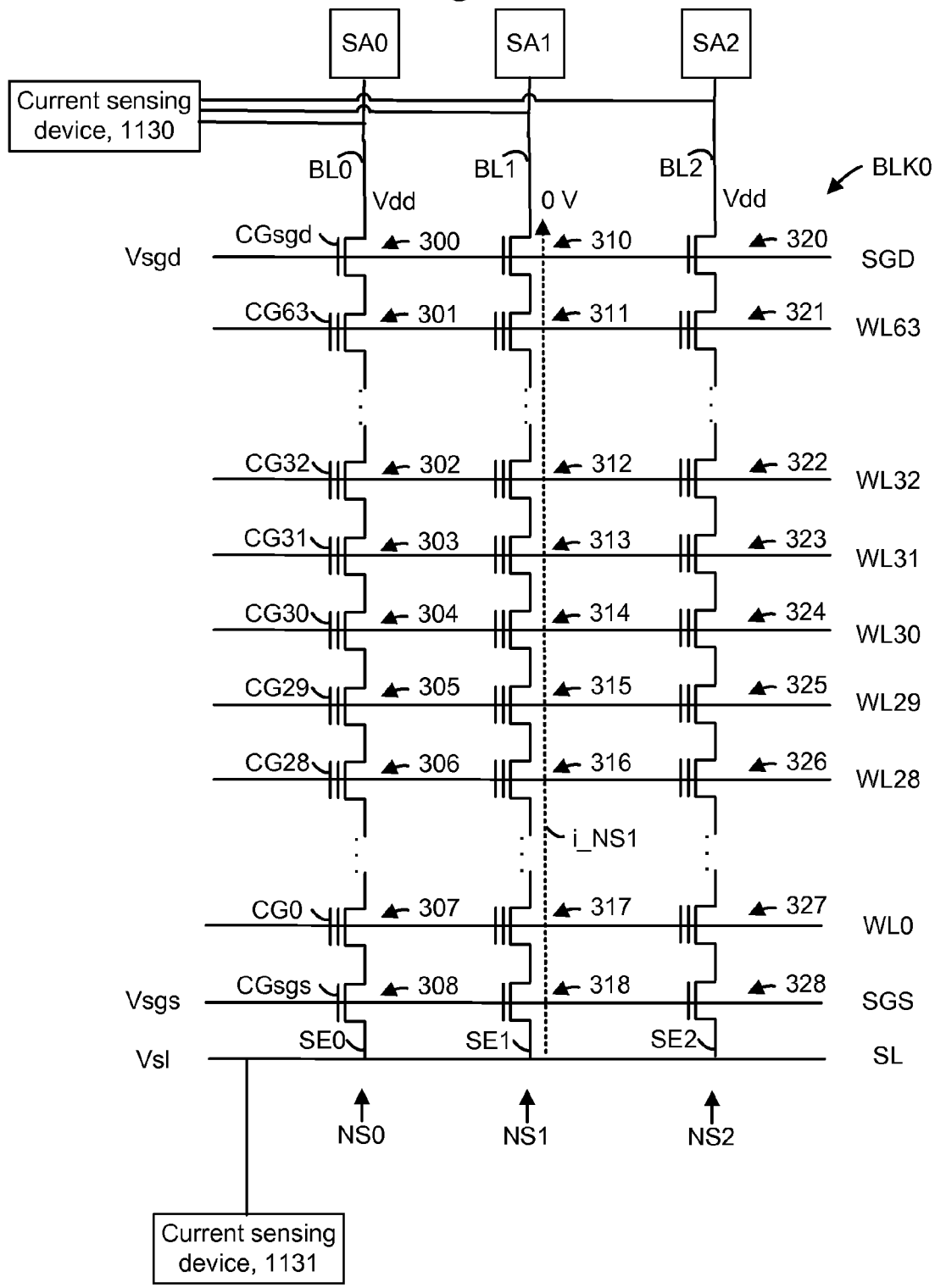

DETECTING PROGRAMMED WORD LINES BASED ON NAND STRING CURRENT

CLAIM OF PRIORITY

This application is a continuation application of U.S. patent application Ser. No. 13/932,384, entitled "Detecting Programmed Word Lines Based On Nand String Current," by Mui et al., filed Jul. 1, 2013, published as US 2015/0003162 on Jan. 1, 2015 and issued as U.S. Pat. No. 8,964,480 on Feb. 24, 2015, and incorporated by reference herein in its entirety.

BACKGROUND

The present technology relates to technology for non-volatile memory.

Semiconductor memory is used in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

Moreover, ultra high density storage devices have been proposed using a 3D stacked memory structure sometimes referred to as a Bit Cost Scalable (BiCS) architecture. For example, a 3D NAND stacked memory device can be formed from an array of alternating conductive and dielectric layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

When programming a 2D or 3D EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. A program-verify operation can be performed to determine that the threshold voltage of a memory cell has been raised above a desired level Similarly, when erasing a flash memory device, an erase voltage is applied, and an erase-verify operation is performed to determine whether the threshold voltages of the memory cells have been decreased below a desired level.

BRIEF DESCRIPTION OF THE DRAWINGS

FIG. 8A depicts an example process for erasing a block.
FIG. 8B depicts an example process for determining a number (Nwl) of programmed word lines in accordance with step 801 of FIG. 8A.
FIG. 8C depicts an example process for performing an erase operation with an erase-verify test based on Nwl, in accordance with step 802 of FIG. 8A.
FIG. 11A depicts current flow in NAND strings during an example all bit line sensing process of an erase-verify test.
FIG. 11B depicts current flow in NAND strings during a sensing process of even-numbered bit lines in connection with an erase-verify test.
FIG. 11C depicts current flow in NAND strings during a sensing process of odd-numbered bit lines in connection with an erase-verify test.

DETAILED DESCRIPTION

Figure 1A:
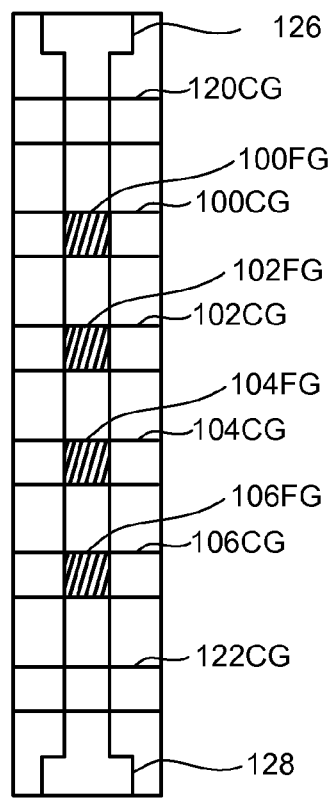
FIG. 1A is a top view of a NAND string.

Technology is described herein for detecting a number of programmed word lines in a non-volatile memory device such as a NAND memory device.

In a NAND memory device, data is programmed into memory cells in various blocks over the memory die. Each block comprises multiple word line (WLs). A memory management system may be used which allows a relatively small amount of data (e.g., system data) to be written to a block. Some time later, the block is erased. Depending on a usage pattern of a host, the system may only program one word line or the first few word lines in a block before erasing the block. The block is only partially programmed in this case.

In the case of 2D NAND memory, an erase operation typically involves applying an erase voltage to the substrate on which the block is formed followed by performing an erase-verify test for the NAND strings. In the case of 3D NAND memory, an erase operation typically involves applying an erase voltage to one or both ends of a NAND string, then reducing the word line voltage. Or, the erase operation for the 3D NAND memory could be the same as for 2D NAND memory depending on the architecture of the 3D NAND memory. Subsequently, an erase-verify test is performed.

The erase-verify test applies an erase verify voltage (VvE) to the word lines while performing a sense operation which determines whether each NAND string is in a conductive state. Each NAND string may include a channel region which extends horizontally in a substrate in the case of 2D NAND, or in a vertically in a channel layer of a memory hole, in the case of 3D NAND. The sense operation determines a conductivity of the channel region. If each memory cell in a NAND string is strongly conductive, the current in the channel will be relatively high (e.g., the channel resistance will be relatively low) and the memory cells are considered to pass the erase-verify test so that the erase operation is complete. When one or more memory cells are programmed and remaining memory cells in a NAND string are already in the erased state, the NAND string may still pass the erase-verify test due to the relatively low channel resistance which is caused by the erased memory cells in the NAND string. In this case, the one or more programmed memory cells are not erased as deeply as the already-erased memory cells. The memory cells that were shallowly erased will have a relatively high Vth which appears as an upper tail in the erased state Vth distribution. See, e.g., the Vth distribution 601 in FIG. 6A.

When the memory system proceeds to write new host data to the block, and the data is subsequently read, the upper tail of the erased-state Vth distribution can result in E-to-A state failures, where an erased state memory cell is read as being an A state memory cell. Uncorrectable errors can result even when error-correction code (ECC) coding is used. Further, program disturb can increase the Vth distribution of the erased state memory cells, increasing the likelihood of E-to-A state failures.

One solution is to have the system side read each page of the block to identify the last programmed page and to adjust the erase operation based on the last programmed page. Another solution is to read each page of the block to identify the number of programmed word lines and to adjust the erase operation based on the number of programmed word lines. A word line may store one or more pages of data. However, this can result in a performance impact due to the time required to read each page. Another approach is to adjust the erase operation for the different blocks of a memory device so that the programmed memory cells are erased sufficiently deeply, without knowing the actual number of programmed word lines in a block. However, this would result in an excessively deep erase of the already-erased memory cells, reducing the endurance of the memory device.

A solution which overcomes these problems involves identifying the number of programmed word lines in a block based on a combined current in the block. A programmed word line is a word line connected to programmed memory cells and, typically, erased memory cells. An erased word line is a word line which is not connected to programmed memory cells but is connected only to erased memory cells. In one approach, the combined current can be measured at the source line which connects to the source end of each NAND string in a block. In another approach, the combined current can be measured at the bit lines which connect to the drain end of each NAND string in a block.

Typically, data is randomized at the external controller so that the memory cells store the data in the erased state and in each of the programmed states in a predictable manner. A reference combined current can be determined while applying a read pass voltage (Vpass) to each word line in a block so that all of the memory cells are in the conductive state. The value of the reference combined current (Iref) may be stored by the controller. Second, an additional combined current (Iadd) can be measured while applying a demarcation voltage to a selected word line which distinguishes the conductive memory cells, which are in the erased state, from the programmed memory cells, which are in a programmed state such as A, B or C. For a programmed word line, the combined current will be significantly lower than the reference combined current (e.g., Iadd<Iref+margin). It can then be concluded that the selected word line is programmed. If the selected word line is not programmed, the Iadd will be about the same as Iref (e.g., Idd=Iref). It can then be concluded that the selected word line is not programmed.

Different word lines can be selected and the additional combined current measured until a last programmed word line is identified. Based on a known word line programming order, an erased word line may be adjacent to the last programmed word line, after the last programmed word line in the word line programming order. A number (Nwl) of programmed word lines in a block can also be counted. This information can be used in various ways. For example, Nwl may be used to adjust the erase-verify test of an erased operation. In one approach, Nwl may be determined in connection with an erase operation. An erase-verify test can be made relatively hard to pass when Nwl is relatively small and relatively easy to pass when the number is relatively large by adjusting at least one of: a word line voltage (VvE), a source line voltage (Vsl), a sense time, a current trip level, a voltage trip level or a bit line voltage, according to Nwl. By making the erase-verify test relatively hard to pass when Nwl is relatively small and relatively easy to pass when Nwl is relatively large, the programmed memory cells will be erased more uniformly regardless of Nwl.

Another approach uses Nwl of the identity of the last programmed word line to determine a next word line in a block to use for programming. This is useful, e.g., when, after partially programming a block, a controller will assign additional data to be programmed in a next word line or in the remainder of the word lines within a block, so that the block becomes fully programmed. These and other features are described in further detail below.

Figure 1B:
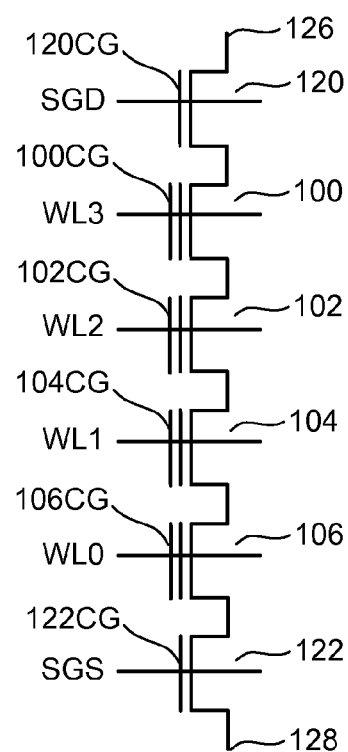
FIG. 1B is an equivalent circuit diagram of the NAND string of FIG. 1A.

One example of a memory system suitable for implementing the present technology uses the NAND flash memory structure, which arranges multiple transistors in series between two select gates. The transistors in series and the select gates are referred to as a NAND string. FIG. 1A is a top view showing one NAND string. FIG. 1B is an equivalent circuit thereof. The NAND string depicted in FIGS. 1A and 1B includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted. Select gate 120 is connected to select line SGD. Select gate 122 is connected to select line SGS.

Figure 2:
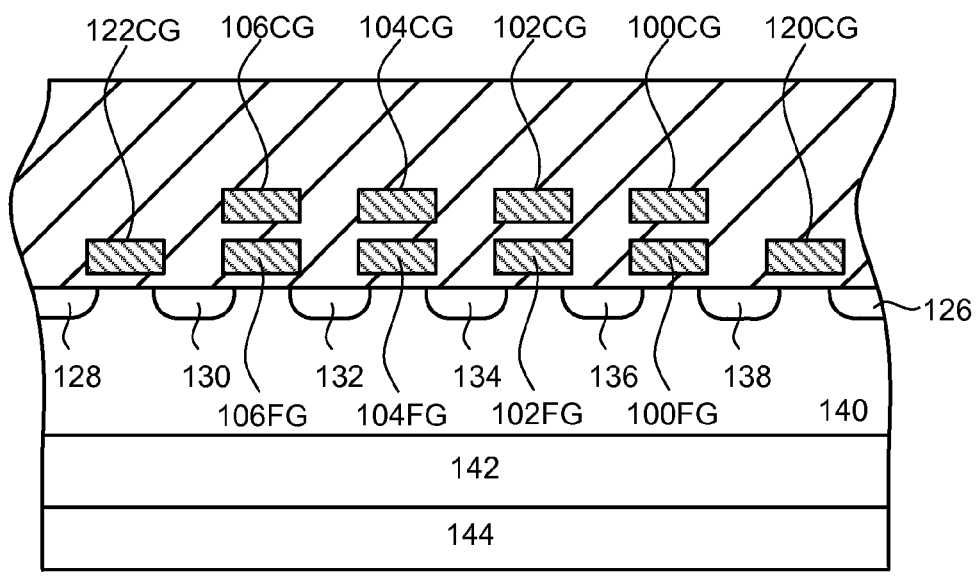
FIG. 2 is a cross-sectional view of the NAND string of FIG. 1A.

FIG. 2 provides a cross-sectional view of the NAND string described above. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 1A-2 show four memory cells in the NAND string, the use of four transistors is provided only as an example. A NAND string used with the technology described herein can have less than four memory cells or more than four memory cells. For example, some NAND strings will include 8, 16, 32, 64 or more memory cells.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0V to the control gate, the memory cell will turn on to indicate logic one is being stored. When the threshold voltage is positive and a read operation is attempted by applying 0V to the control gate, the memory cell will not turn on, which indicates that logic zero is stored.

A memory cell can also store multiple states, thereby storing multiple bits of digital data. When storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells.

Other types of non-volatile memory in addition to NAND flash memory can also be used with the present technology.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, two bits are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

Figure 3:
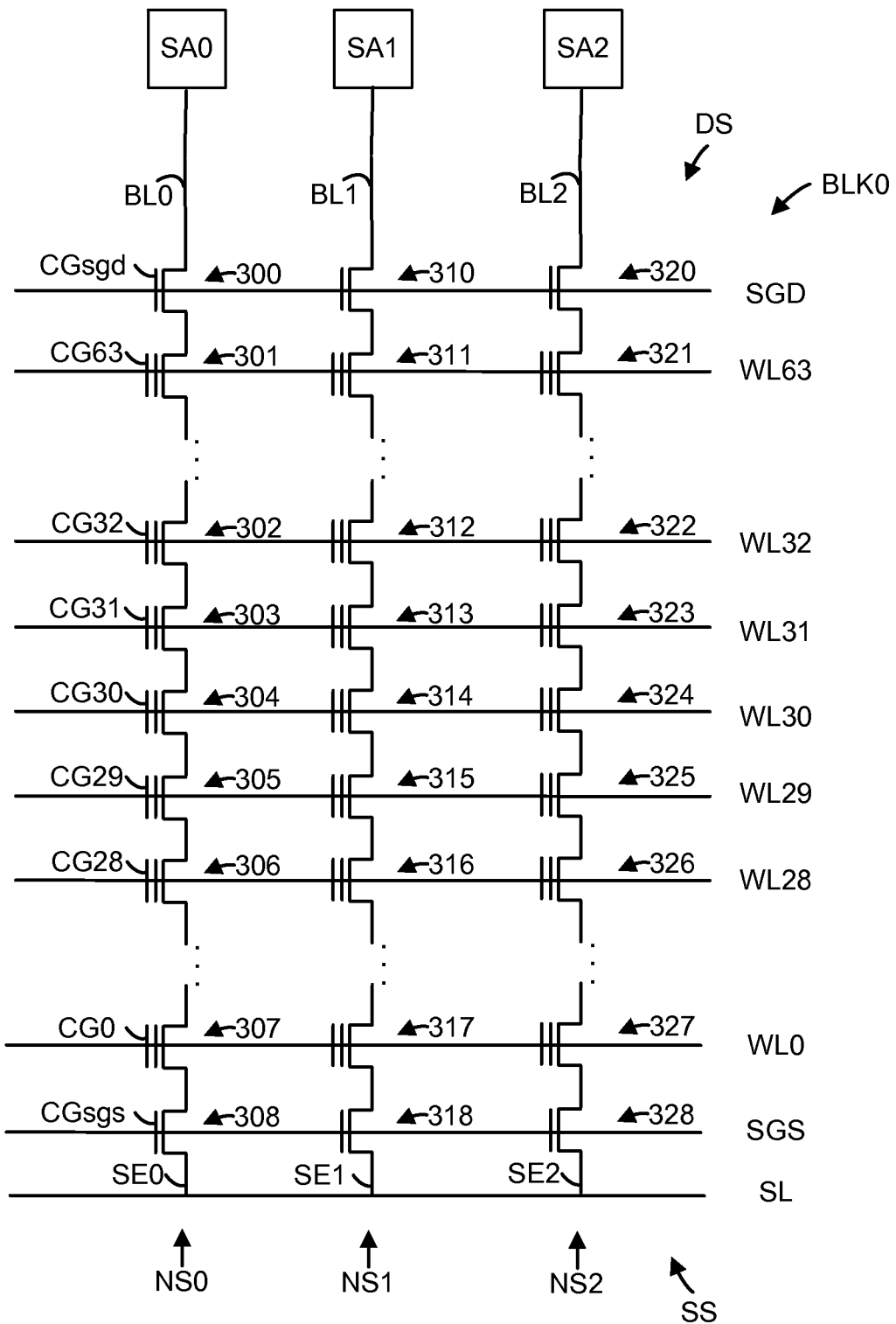
FIG. 3 depicts three example NAND strings such as shown in FIGS. 1A-2 in a block BLK0.

FIG. 3 depicts three example NAND strings such as shown in FIGS. 1A-2 in a block BLK0. BLK0 includes a number of NAND strings NS0, NS1, NS2, . . . and respective bit lines, e.g., BL0, BL1, BL2 . . . in communication with respective sense amplifiers SA0, SA1, SA2, . . . BLK0 comprises a set of memory cells (e.g., non-volatile storage elements). Each NAND string is connected at one end to a select gate, drain (SGD) transistor, and the control gates of the SGD transistors are connected via a common SGD line. The NAND strings are connected at their other end to a select gate, source (SGS) transistor which, in turn, is connected to a common source line (SL). A number of word lines WL0-WL63 extend between the SGS and SGD transistors. WL0 is an edge word line which is adjacent to the source side (SS) of the block and WL63 is an edge word line which is adjacent to the drain side (DS) of the block.

An example NAND string NS0 includes memory cells 301, . . . , 302-306, . . . , 307 with respective control gates CG63, . . . CG32-CG28, . . . CG0, an SGS transistor 308 with a control gate CGsgs and a SGD transistor 300 with a control gate CGsgd. Another example NAND string NS1 includes memory cells 311, . . . , 312-316, . . . , 317, an SGS transistor 318 and a SGD transistor 310. Another example NAND string NS2 includes memory cells 321, . . . , 322-326, . . . , 327, an SGS transistor 328 and a SGD transistor 320. The NAND strings NS0, NS2, . . . are even numbered, and the NAND strings NS1, NS3 (not shown), . . . are odd numbered. Similarly, the bit lines BL0, BL2, . . . are even numbered, and the NAND strings BL1, BL3 (not shown), . . . are odd numbered. The memory cells can store user data and/or non-user data.

Figure 4:
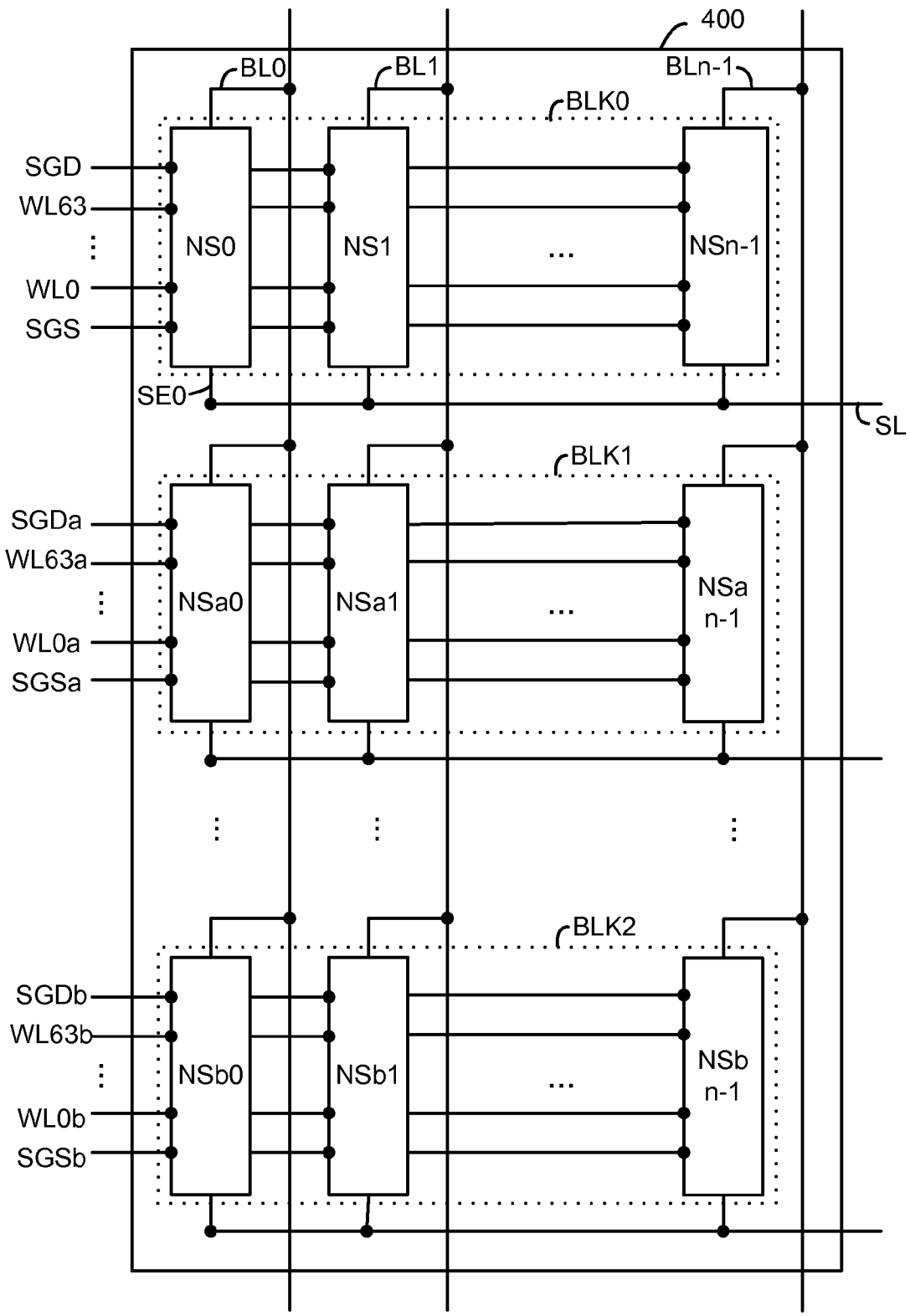
FIG. 4 is a block diagram of an array 400 of NAND flash memory cells including BLK0 of FIG. 3 and additional blocks BLK1 and BLK2.

FIG. 4 is a block diagram of an array 400 of NAND flash memory cells including BLK0 of FIG. 3 and additional blocks BLK1 and BLK2. Along each column, a bit line (BL) is coupled to the drain terminal of the drain select gate for the NAND string. Along each row of NAND strings, a source line (SL) may connect all the source terminals of the source select gates of the NAND strings (e.g., at SE0 of NS0).

The array of memory cells is divided into a large number of blocks (e.g., BLK0-BLK2) of memory cells, where each block includes a set of one or more NAND strings in communication with a common set of word lines, SGS line and SGD line. Each NAND string is also in communication with a respective bit line. For example, BLK0 includes NAND strings NS0, NS1, . . . , NSn−1 in communication with BL0, BL1, . . . BLn−1, respectively, and with WL0-WL63 SGS and SGD. BLK1 includes NAND strings NSa0, NSa1, . . . , NSan−1 in communication with BL0, BL1, . . . BLn−1, respectively, and with WL0a-WL63a, SGSa and SGDa. BLK2 includes NAND strings NSb0, NSb1, . . . , NSbn−1 in communication with BL0, BL1, . . . BLn−1, respectively, and with WL0b-WL63b, SGSb and SGDb.

As is common for flash EEPROM systems, the block is the unit of erase. That is, each block contains the minimum number of memory cells that are erased together. Each block is typically divided into a number of pages. A page is the smallest unit of programming One or more pages of data are typically stored in one row of memory cells. For example, a row typically contains several interleaved pages or it may constitute one page. All memory cells of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Memory cells are erased in an example 2D NAND embodiment by raising the p-well to an erase voltage (e.g., 15-20 V) for a sufficient period of time and grounding or applying a low bias, e.g., 1 V, on the word lines of a selected block while the source and bit lines are floating. Due to capacitive cross coupling ("cross" denotes coupling from neighboring memory cells), the bit lines, select lines, and common source are also raised to a significant fraction of the erase voltage. A strong electric field is thus applied to the tunnel oxide layers of selected memory cells and the data of the selected memory cells are erased as electrons of the floating gates are emitted to the substrate side. As electrons are transferred from the floating gate to the p-well region, the threshold voltage of a selected cell is lowered. Erasing can be performed on the entire memory array, separate blocks, or another unit of cells.

Figure 5:
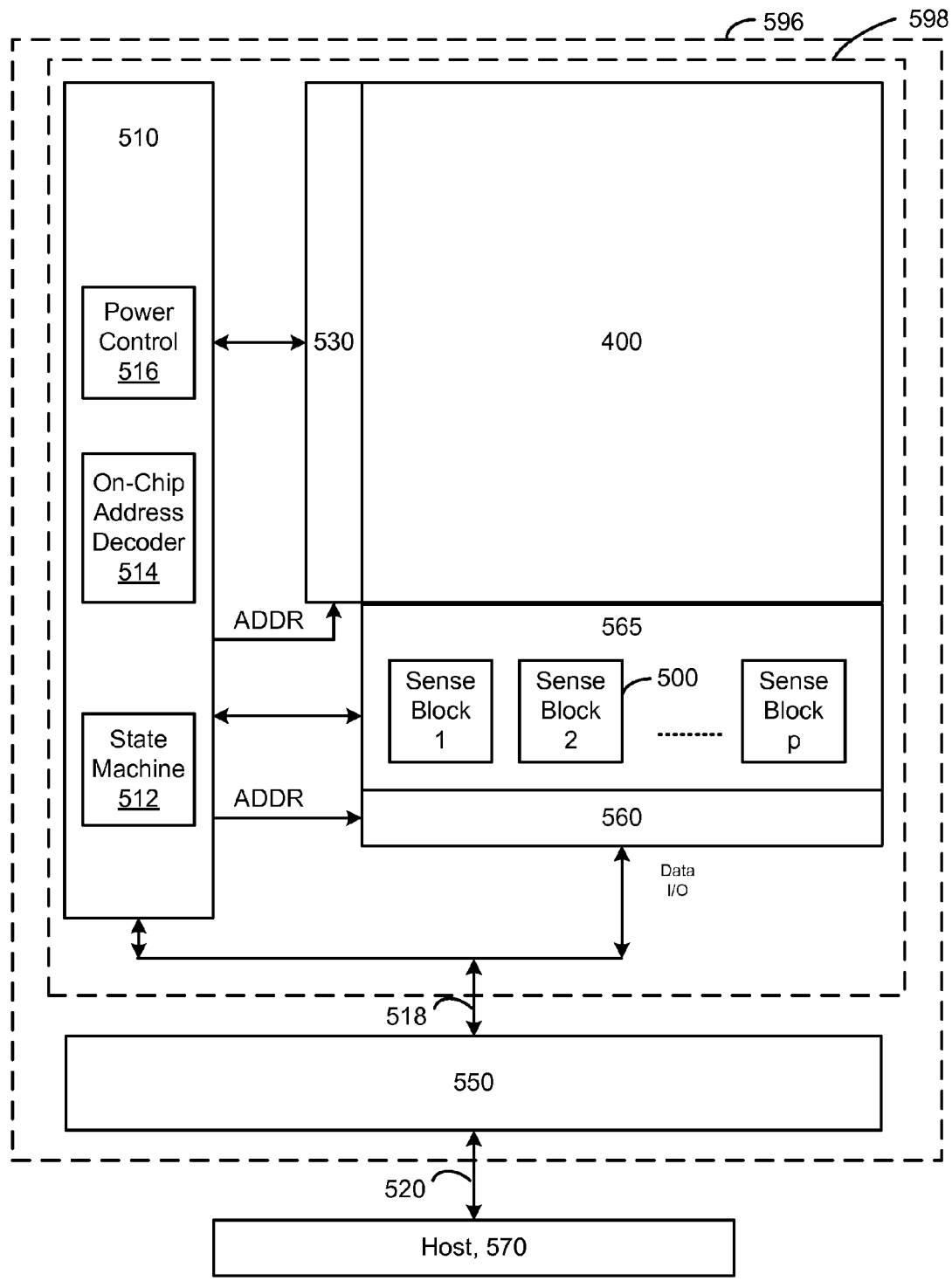
FIG. 5 is a block diagram of a non-volatile memory system which includes the array 400 of FIG. 4.

FIG. 5 is a block diagram of a non-volatile memory system which includes the array 400 of FIG. 4. The non-volatile memory system comprises a memory device 596 having read/write circuits for reading and programming a page of memory cells in parallel, according to one embodiment of the present technology. Memory device 596 may include one or more memory die 598. Memory die 598 includes a two-dimensional array of memory cells 400, control circuitry 510, and read/write circuits 565. The memory array 400 is addressable by word lines via a row decoder 530 and by bit lines via a column decoder 560. The read/write circuits 565 include multiple sense blocks 500 and allow a page of memory cells to be read or programmed in parallel. Typically a controller 550 is included in the same memory device 596 (e.g., a removable storage card) as the one or more memory die 598. Commands and Data are transferred between the host 570 and controller 550 via lines 520 and between the controller and the one or more memory die 598 via lines 518.

The control circuitry 510 cooperates with the read/write circuits 565 to perform memory operations on the memory array 400. The control circuitry 510 includes a state machine 512, an on-chip address decoder 514 and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In another approach, dual row/column decoders and read/write circuits are used. A control circuit can be considered to comprise one or more of the components 510, 512, 514, 516, 530, 550, 560, 565, for instance.

Figure 6A:
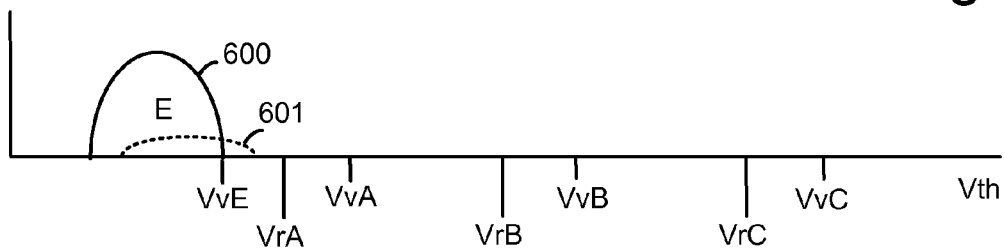
FIG. 6A depicts a threshold voltage (Vth) distribution of memory cells in an erased state after an erase operation which does not account for a number of programmed word lines.

FIG. 6A depicts a threshold voltage (Vth) distribution of memory cells in an erased state after an erase operation which does not account for a number of programmed word lines. The Vth distributions are shown separately for one or more programmed word lines (Vth distribution 601) and for the remaining, erased word lines (Vth distributions 600). The erase-verify test applies the VvE to each of the word lines while determining whether the NAND strings are in a conductive state. As mentioned at the outset, the programmed memory cells connected to the one or more programmed word lines will be shallowly erased, as indicated by an upper portion of the Vth distribution 601 exceeding VvE. In contrast, the erased memory cells will be erased to an appropriate depth.

Figure 6B:
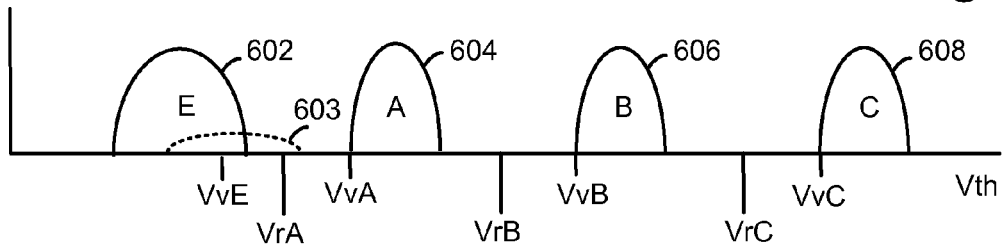
FIG. 6B depicts a Vth distribution which follows FIG. 6A after a programming operation.

FIG. 6B depicts a Vth distribution which follows FIG. 6A after a programming operation. This example includes the erased state (E) and three programmed states (A, B and C) for a total of four data states. Other examples can include eight, sixteen or more data states. VvA, VvB and VvC are verify levels used for programming of the A-, B- and C-states, respectively. VrA, VrB and VrC are read levels which are used in a subsequent read operation. Programming of some of the memory cells from the erased state to the programmed states can result in coupling up of the Vth distributions 600 and 601 of FIG. 6A to the Vth distributions 602 and 603, respectively. As a result, the upper tail of the Vth distribution 603 is increased past VrA so that some of the E-state memory cells will be incorrectly read as A-state memory cells. The Vth distributions 604, 606 and 608 represent the A-, B- and C-state memory cells. The problem of the E-state memory cells being incorrectly read as A-state memory cells can occur even without program disturb.

Figure 6C:
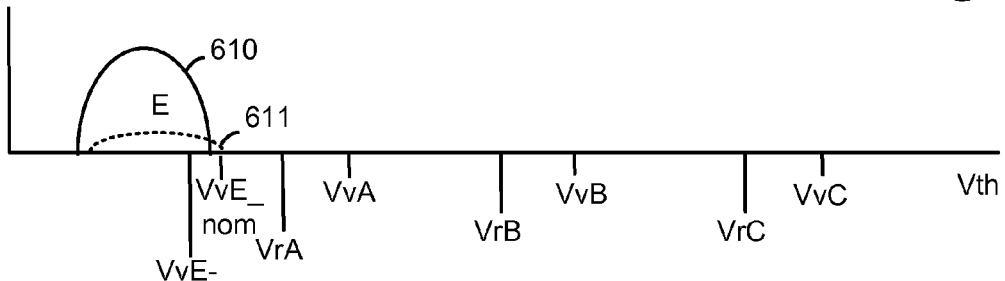
FIG. 6C depicts a Vth distribution of memory cells in an erased state after an erase operation which accounts for a number of programmed word lines.

FIG. 6C depicts a Vth distribution of memory cells in an erased state after an erase operation which accounts for a number of programmed word lines. In this case, the Vth distribution 611 for the one or more programmed word lines is at an appropriate depth, and is shifted lower compared to the Vth distribution 601 of FIG. 6A. The Vth distribution 610 for the erased word lines is also at an appropriate depth. One option to achieve the Vth distribution 611 for the one or more programmed word lines is to reduce the verify level, e.g., from a nominal level, VvE_nom, to a reduced value, VvE−. VvE_nom may be used for a fully programmed block, while VvE− may be used for a partially programmed block. Intermediate levels of VvE, between VvE− and VvE_nom may be used based on a degree to which the block is programmed. Reducing VvE makes it harder for the programmed memory cells to pass the erase-verify test so that they will be more deeply erased when they do pass the erase-verify test. Other options to make it harder for the programmed memory cells to pass the erase-verify test are discussed, e.g., in connection with FIG. 8D.

Figure 6D:
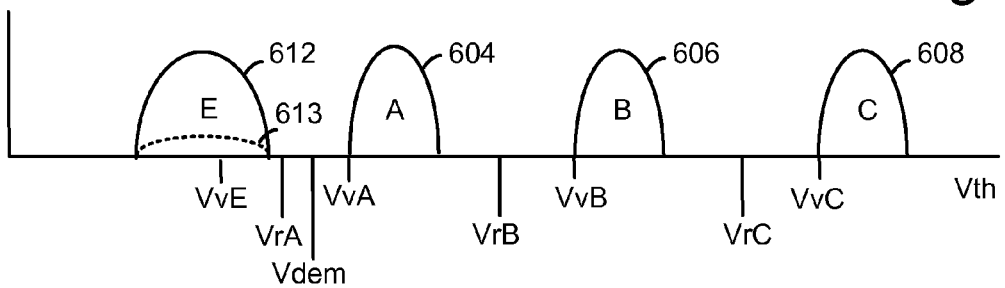
FIG. 6D depicts a Vth distribution which follows FIG. 6C after a programming operation.

FIG. 6D depicts a Vth distribution which follows FIG. 6C after a programming operation. As before, programming of some of the memory cells from the erased state to the programmed states can result in coupling up of the Vth distributions 610 and 611 of FIG. 6C to the Vth distributions 612 and 613, respectively. In this case, the upper tail of the Vth distribution 613 is still below VrA. This prevents the E-state memory cells being incorrectly read as A-state memory cells. The Vth distributions 604, 606 and 608 represent the A-, B- and C-state memory cells as before. A demarcation voltage, Vdem, is between VvA and the upper tail of the E-state. Vdem is a read voltage which can be applied to a selected word line in a current sensing operation so that the programmed memory cells will be in a non-conductive state and the erased state memory cells will be in a conductive state. See also step 814 of FIG. 8B, and FIGS. 15B and 15C.

Figure 7:
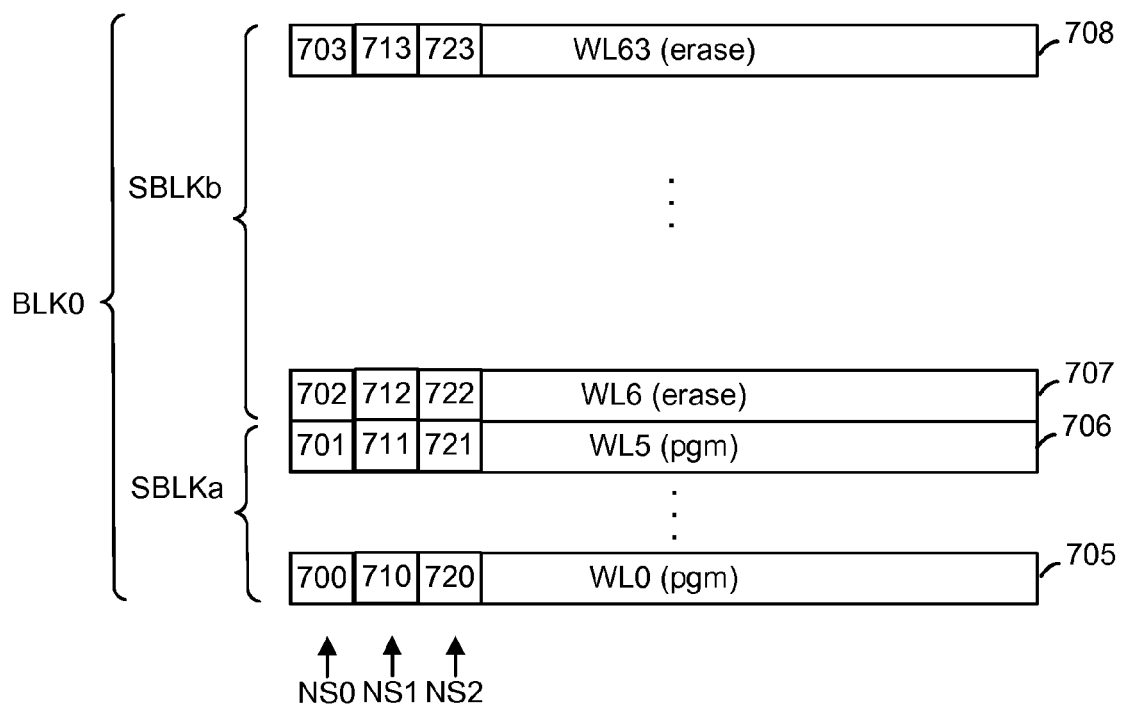
FIG. 7 depicts an example of a partially programmed block BLK0 comprising programmed word lines WL0-WL5 and erased word lines WL6-WL63.

FIG. 7 depicts an example of a partially programmed block BLK0 comprising programmed word lines WL0-WL5 and erased word lines WL6-WL63. Example NAND strings and memory cells are also depicted. For example, WL0 705 includes memory cells 700, 710 and 720 in NAND strings NS0, NS1 and NS2, respectively. WL5 706 includes memory cells 701, 711 and 721 in NAND strings NS0, NS1 and NS2, respectively. WL6 707 includes memory cells 702, 712 and 722 in NAND strings NS0, NS1 and NS2, respectively. WL63 708 includes memory cells 703, 713 and 723 in NAND strings NS0, NS1 and NS2, respectively. Further, as an example, memory cells 700, 711, 722 and 703 may be in the erased state and memory cells 710, 720, 701, 721, 702, 712, 713 and 723 may be in a programmed state. The programmed word lines WL0-WL5 are part of a sub-block SBLKa and the erased word lines WL6-WL63 are part of another sub-block SBLKb. In this example, the programmed word lines are adjacent to one another. It is also possible for programmed word lines to be non-adjacent.

FIG. 8A depicts an example process for erasing a block. Step 800 involves deciding to perform an erase operation for a block. Step 801 involves determining a number (Nwl) of programmed word lines in the block. Recall that a programmed word line is a word line which is connected to programmed memory cells. Step 802 involves performing an erase operation with an erase-verify test based on Nwl. That is, the erase-verify test is configured based on Nwl. A decision to perform an erase operation can be made by a host 570 or controller 550 (FIG. 5), for instance, by issuing an appropriate erase command. In connection with the erase operation, and in response to the decision to perform the erase operation and the erase command, an additional action can be taken such as determining Nwl. When a decision is made to erase a block, the block is typically considered to be in a state other than fully erased. That is, the block is either partially or fully programmed. The host or controller may maintain status data which indicates whether or not a block is fully erased so that it issues an erase command only for a block which is partially or fully programmed.

FIG. 8B depicts an example process for determining a number (Nwl) of programmed word lines in accordance with step 801 of FIG. 8A. Step 810 includes applying Vpass to all word lines in a block while measuring a combined current through NAND strings in the block. Vpass is sufficiently high to cause all of the memory cells to be in a conductive state. Step 811 includes storing the measured combined current as a reference combined current (Iref). For example, a magnitude of the combined current can be digitized and stored in the state machine 512. Step 812 initializes Nwl=0. Step 813 selects a word line, e.g., to determine whether it is in a programmed or erased state. For example, WL0 can be selected initially. A sequential, not-sequential or a random word line selection order can be used. Step 814 includes applying Vpass (e.g., 6-8 V) to all unselected word lines in the block while applying Vdem to the selected word line and while measuring an additional combined current (Iadd) through the NAND strings in the block.

Optionally, step 812 can concurrently select multiple word lines which are adjacent or non-adjacent.

Since Vpass is applied to the unselected word lines (e.g., WL1-WL63), the memory cells of these word lines will be in a strongly conductive state. For each NAND string, the memory cell connected to the selected word line will dictate the current in the NAND string. The Iadd will be relatively low when the memory cell is in a programmed state and relatively high when the memory cell is in an erased state. Therefore, Iadd will be roughly equal to Iref when the memory cells of the selected word line are all in the erased state. Iadd will be significantly lower than Iref (by at least a margin which can be determined from testing) when some of the memory cells of the selected word line are in the programmed states and others are in the erased state. This is due to the programmed memory cells being non-conductive and thereby blocking current in the NAND string. For example, assume that, in a selected word line, 25% of the memory cells are in the erased state, 25% of the memory cells are in the A-state, 25% of the memory cells are in the B-state and 25% of the memory cells are in the C-state. Thus, when Vdem is between the erased state and the A-state, 75% of the NAND strings will have relatively little current (e.g., the NAND string having the A-, B- and C-state memory cells), while 25% of the NAND strings (e.g., the NAND string having the erased state memory cells) will have a more substantial current. The additional combined current could be roughly 25% of the reference combined current, for instance. The margin could 10-25% or more of the reference combined current, for example.

In one approach, the magnitude of the additional combined current can be digitized and compared to the stored value of the reference combined current in the state machine 512.

Step 815 increments Nwl if Iadd<Iref+margin. Measuring Iref at substantially the same time as Iadd provides a suitable baseline measurement for comparison. Iref indicates an actual current flow for the block, and can change as the block accumulates program-erase cycles. Moreover, any inaccuracy in measuring the current will affect Iref and Iadd equally so that their relative levels can still be determined accurately.

Decision step 816 determines whether a next word line is to be analyzed. One approach is to analyze each word line in a sequential order starting from WL0 (the word line at the source side of the block, closest to the source line) and proceed one word line at a time toward the drain side of the block until a first erased word line is located. The word line which is before the word line in the erased state is the last programmed word line. The first word line in the erased state may be a next word line for writing data, in one approach (see FIG. 8E). For example, if WL0-WL5 are programmed word lines, the next word line to program is WL6. In this option, the identifying of one or more selected word lines is performed for one word line of the plurality of word lines followed directly by another word line of the plurality of word lines, where the one word line is adjacent to the another word line.

In another option, the identifying the one or more selected word lines is performed for one word line of the plurality of word lines followed directly by another word line of the plurality of word lines, where the one word line is separated from the another word line by at least one other word line. One approach is to select WL0 first since this is usually the first programmed word line. The next selected word line can be spaced apart from WL0 by other word lines. For example, the selection order can be: WL0, WL31, WL1, WL32, . . . .

If decision step 816 indicates there is a next word line to analyze, the next word line is selected at step 813 and Iadd is again determined at step 814. If decision step 816 indicates there is no next word line to analyze, the process is done at step 817.

Figure 8D:
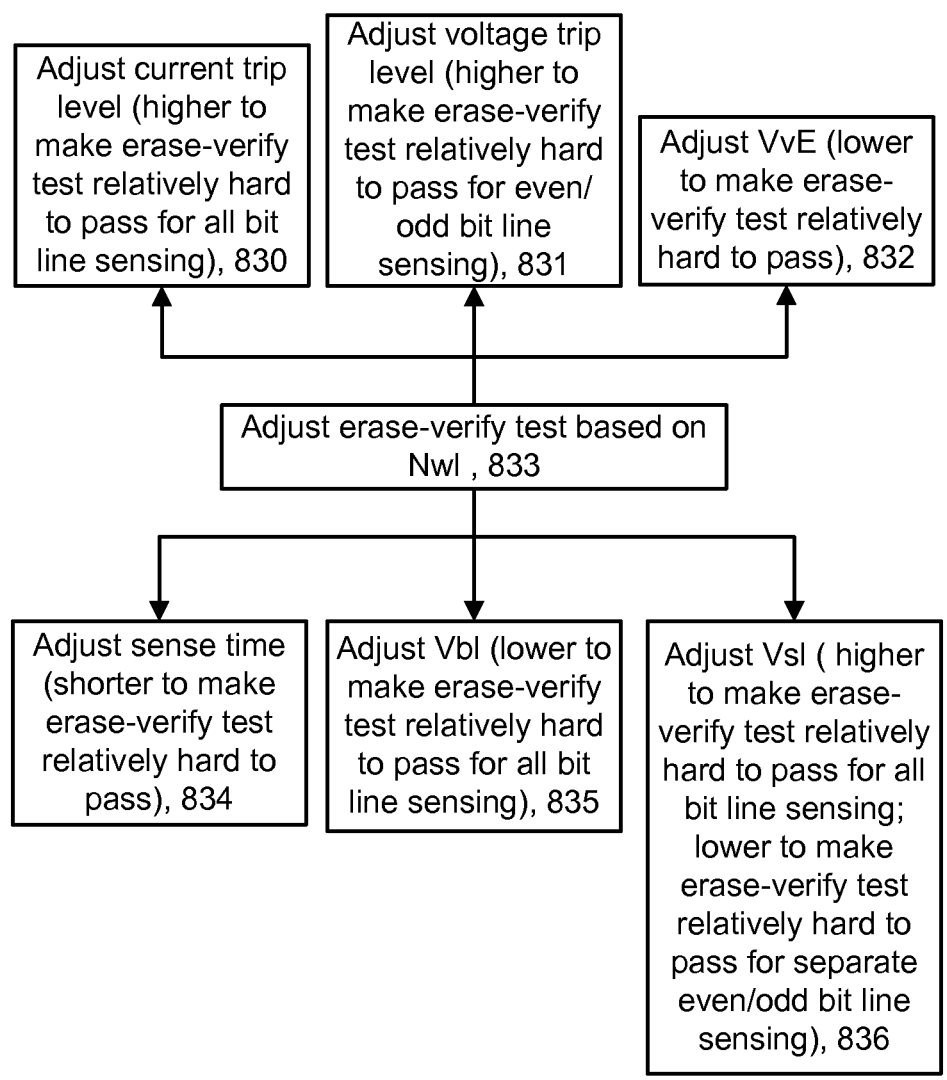
FIG. 8D depicts an example process for adjusting an erase-verify test based on Nwl, in accordance with step 822 of FIG. 8C.
Figure 9:
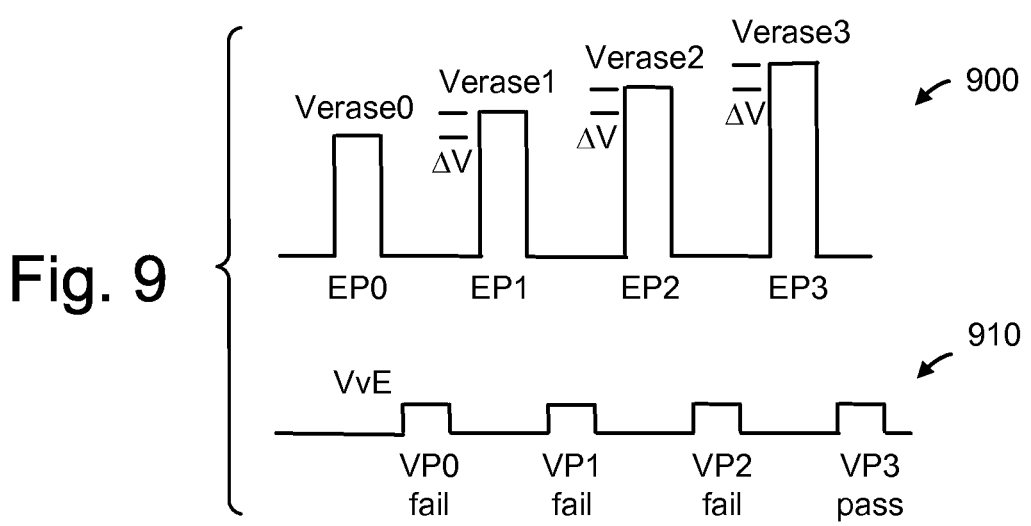
FIG. 9 depicts an example erase operation in which each erase pulse is followed by a verify pulse, in accordance with FIG. 8C.

FIG. 8C depicts an example process for performing an erase operation with an erase-verify test based on Nwl, in accordance with step 802 of FIG. 8A. Referring also to FIG. 9, step 820 involves initialize the erase voltage, Verase, e.g., to Verase0. Step 821 involves applying Verase to the substrate for a 2D NAND memory device or to one or more ends of the NAND strings for a 3D NAND memory device. A 3D NAND memory device can be erased using a one-sided erase in which Verase is applied to the drain end of the NAND strings via the bit lines, or using a two-sided erase in which Verase is also applied to the source end of the NAND strings via the source lines. Step 822 includes performing an erase-verify test. The erase-verify test is made relatively hard to pass when Nwl is relatively small. Conversely, the erase-verify test is made relatively easy to pass when Nwl is relatively large. See FIG. 8D for further details. Nwl is relatively small when there is one or a few programmed word lines in a block, e.g., a small portion of all word lines in a block. Nwl is relatively large when it all or most word lines in a block are programmed. The erase-verify test involves sensing whether the memory cells of the block are in a conductive state, e.g., when VvE is applied to all of the word lines.

Optionally, a lower value of VvE (e.g., VvE−) is applied to the programmed word lines while a higher value of VvE (e.g., VvE_nom) is applied to the erased word lines.

Decision step 823 determines if the erase-verify test has been passed. Typically a pass is declared when all, or almost all of the memory cells in a block are in a conductive state when VvE is applied to the word lines. If decision step 823 is true, the erase operation ends successfully at step 826. If decision step 823 is false, decision step 824 determines whether Verase has exceeded a maximum allowed level, Verase_max. If decision step 824 is false, the erase operation fails at step 827. If decision step 824 is true, Verase is stepped up at step 825 and a next erase pulse is applied at step 821.

FIG. 8D depicts an example process for adjusting an erase-verify test based on Nwl, in accordance with step 822 of FIG. 8C. Step 833 involves adjusting the erase-verify test based on Nwl, the number of programmed word lines in a block. An erase-verify test that is relatively hard to pass (e.g., stricter) results in a relatively deeper erase depth for the memory cells. This ensures that the erasing is sufficiently deep even when Nwl is small. Step 833 can be implemented by one or more of the other steps. For example, these steps include: adjust current trip level (higher to make erase-verify test relatively hard to pass for all bit line sensing), 830; adjust voltage trip level (higher to make erase-verify test relatively hard to pass for even/odd bit line sensing), 831; adjust VvE (lower to make erase-verify test relatively hard to pass), 832; adjust sense time (shorter to make erase-verify test relatively hard to pass), 834; adjust Vbl (lower to make erase-verify test relatively hard to pass for all bit line sensing), 835; and adjust Vsl (higher to make erase-verify test relatively hard to pass for all bit line sensing; lower to make erase-verify test relatively hard to pass for separate even/odd bit line sensing), 836.

Figure 13A:
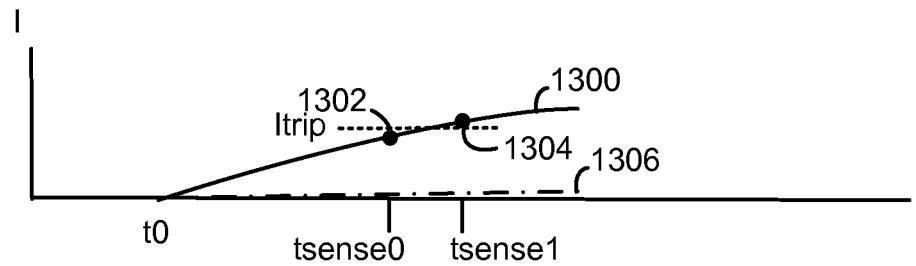
FIG. 13A depicts a sensed current for the sensing scheme of FIG. 11A, where a current sense time is an adjustable parameter, in accordance with step 834 of FIG. 8D.
Figure 13B:
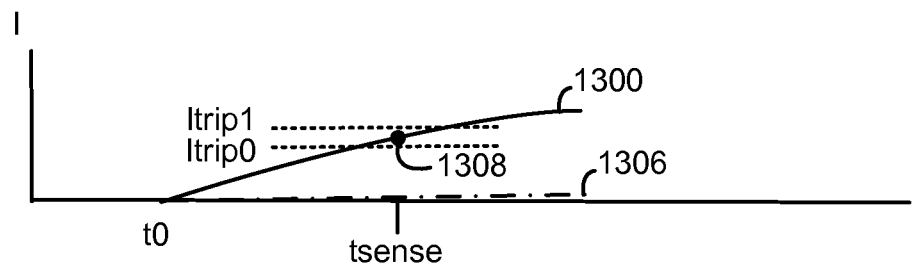
FIG. 13B depicts a sensed current for the sensing scheme of FIG. 11A, where a current trip level is an adjustable parameter, in accordance with step 830 of FIG. 8D.

Regarding step 830, FIG. 13B provides examples of different current trip levels Itrip0 and Itrip1. Additional current trip levels could be used as well. The erase-verify test is relatively hard to pass if Itrip is higher, for a given tsense. Regarding step 831, FIG. 14B provides examples of different voltage trip levels, Vtrip0 and Vtrip1. Additional voltage trip levels could be used as well. The erase-verify test of the erase-verify test is relatively hard to pass if Vtrip is higher, for a given tsense. Regarding step 832, FIG. 6C provides an example of VvE_nom, a nominal erase-verify voltage and VvE−, a lower erase-verify voltage. The erase-verify test is relatively hard to pass if VvE is lower, since the memory cells need to be erased more deeply to pass the erase-verify test. Regarding step 834, FIGS. 13A and 14A provide examples of different sense times, tsense0 and tsense1. Additional sense times could be used as well. The erase-verify test is relatively hard to pass if tsense is lower, for a given Itrip (FIG. 13A) or Vtrip (FIG. 14A). Regarding step 835, in FIGS. 13A-13C, current (I) is generated in proportion to Vbl, at a fixed Vsl. So, current will be greater when Vbl is greater, at a fixed Vsl. The erase-verify test is relatively hard to pass if Vbl is lower, for a given Itrip and tsense.

Regarding step 836, for the all bit line sensing discussed in connection with FIGS. 13A-13C, current (I) is generated in proportion to VvE−Vsl. When Vsl is higher, the apparent Vth of the memory cells is raised. So current will be lower when Vsl is greater. Thus, the erase-verify test is relatively hard to pass if Vsl is greater, for a given Vbl, Itrip and tsense. For the even/odd bit line sensing discussed in connection with FIGS. 14A-14C, Vsense is generated in proportion to Vsl, so Vsense will be greater when Vsl is greater. The erase-verify test is relatively hard to pass if Vsl is lower, for a given Vtrip and tsense.

Figure 8E:
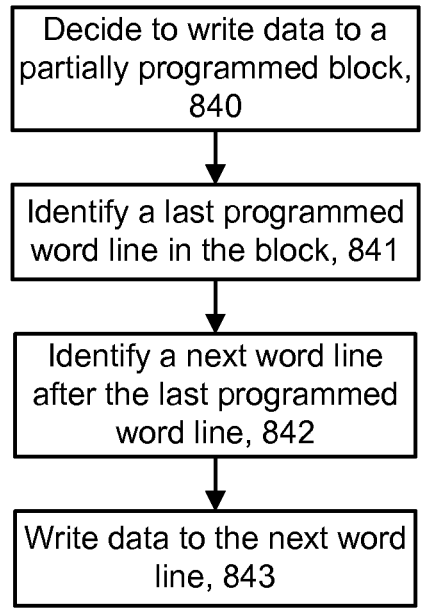
FIG. 8E depicts an example process for writing data to a partially programmed block.

FIG. 8E depicts an example process for writing data to a partially programmed block. Step 840 includes deciding to write data to a partially programmed block. In some cases, one or more word lines of a block may be programmed at one time. At a later time, it may be desired to write additional data to the block. One approach is for the state machine to store data which identifies the last programmed word line in a block. However, this results in an additional storage requirement. Another solution is to identify the last programmed word line in a block (step 841) using the combined current measuring techniques discussed, identify a next word line after the last programmed word line at step 842, and write data to the next word line at step 843. For example, Nwl=6, indicating that WL0-WL5 are programmed. As a result, assuming a sequential word line programming order, the next word line to write data to is WL6. Alternatively, the last programmed word line can be identified without counting up to Nwl.

FIG. 9 depicts an example erase operation in which each erase pulse is followed by a verify pulse, in accordance with FIG. 8C. An erase operation can be performed for a block of memory cells by applying one or more erase pulses, e.g., EP0-EP3 (waveform 900) to a substrate on which the block is formed in a 2D NAND memory device, or to the ends of the NAND strings in a 3D NAND memory device. After the first erase pulse EP0, the peak amplitude of each erase pulse can be stepped up from the previous erase pulse by a step size $\Delta V$. In one approach, after each erase pulse is applied to the substrate, a verify operation is performed as represented by waveform 910. Waveform 910 shows verify pulses or voltages VP0-VP3 of amplitude VvE which are applied to one or more word lines of memory cells being erased. VP0-VP3 are verify pulses associated with, and following, EP0-EP3, respectively. In this example, it is assumed that the erase operation ends successfully. Thus, the erase-verify test associated with VP0-VP2 is failed, and the erase-verify test associated with VP3 is passed.

Figure 10A:
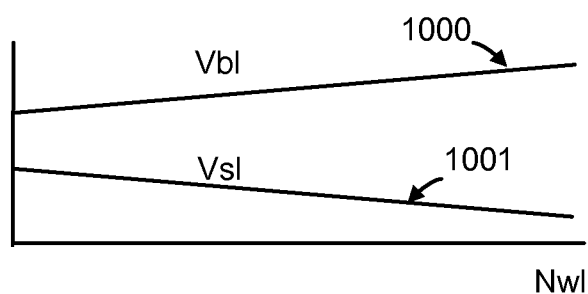
FIG. 10A depicts an adjusted value of Vbl and Vsl as a function of Nwl, in accordance with steps 835 and 836, respectively, of FIG. 8D.

FIG. 10A depicts an adjusted value of Vbl and Vsl as a function of Nwl, in accordance with steps 835 and 836, respectively, of FIG. 8D. As discussed, the erase-verify test can be made relatively harder to pass when Nwl is relatively small by increasing Vsl (plot 1001) or by lowering Vbl (plot 1000). Vsl can decrease as Nwl increases. Vbl can increase as Nwl increases.

Figure 10B:
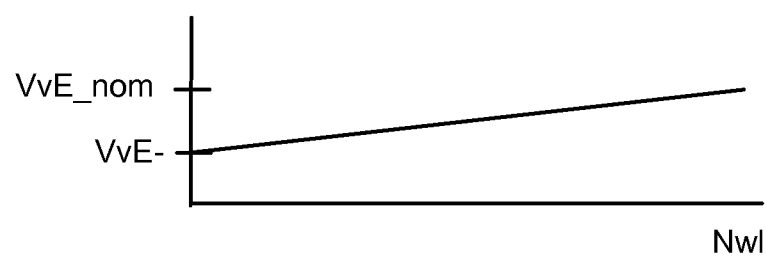
FIG. 10B depicts an adjusted value of VvE as a function of Nwl, in accordance with step 832 of FIG. 8D.

FIG. 10B depicts an adjusted value of VvE as a function of Nwl, in accordance with step 832 of FIG. 8D. As discussed, the erase-verify test can be made relatively harder to pass when Nwl is relatively small by decreasing VvE, e.g., from a nominal level of VvE_nom to a reduced level of VvE−. VvE_nom may be used for a fully programmed block, while VvE− may be used for a partially programmed block, e.g., with only one or a few programmed word lines. Intermediate levels of VvE, between VvE− and VvE_nom may be used based on a degree to which the block is programmed.

FIG. 11A depicts current flow in NAND strings during an example all bit line sensing process of an erase-verify test. BLK0 includes example NAND strings NS0-NS2 and associated sense amplifiers SA0-SA2, respectively, connected to bit lines BL0-BL2, respectively. An SGD line is connected to control gates of SGD transistors 300 (having example control gate CGsgd), 310 and 320. WL63 is connected to control gates of memory cells 301 (having example control gate CG63), 311 and 321. WL32 is connected to control gates of memory cells 302 (having example control gate CG32), 312 and 322. WL31 is connected to control gates of memory cells 303 (having example control gate CG31), 313 and 323. WL30 is connected to control gates of memory cells 304 (having example control gate CG30), 314 and 324. WL29 is connected to control gates of memory cells 305 (having example control gate CG29), 315 and 325. WL28 is connected to control gates of memory cells 306 (having example control gate CG28), 316 and 326. WL0 is connected to control gates of memory cells 307 (having example control gate CG0), 317 and 327. An SGS line is connected to control gates of SGS transistors 308 (having example control gate CGsgs), 318 and 328. The source ends SE0-SE2 of NS0-NS2, respectively, are connected to a common source line SL. The sensing can be used as part of an erase-verify test, as discussed.

In an example sensing process referred as negative all bit line sensing, the current is sensed concurrently in each NAND string in a block, by the sense amplifiers associated with those NAND strings. For example, the current in NS0, NS1 and NS2 is i_NS0, i_NS1 and i_NS2, respectively, as sensed by sense amplifiers SA0, SA1 and SA2, respectively. Further, in a first approach, the memory cells of all of the word lines are verified concurrently. For example, to determine whether an erase operation is completed for a block, WL0-WL63 can receive VvE such as 0 V. Or, to determine whether a selected word line is programmed, the selected word line can receive Vdem while the unselected word lines receive Vpass.

In a second approach, the memory cells of even-numbered word lines are verified concurrently, after which the memory cells of odd-numbered word lines are verified concurrently. When the memory cells of even-numbered word lines are verified, WL0, WL2, . . . , WL62 can receive VvE or Vdem while WL1, WL3, . . . , WL63 can receive Vpass. In a third approach, the memory cells of odd-numbered word lines are verified concurrently, after which the memory cells of even-numbered word lines are verified concurrently. Thus, regardless of whether all bit line sensing or even/odd (source-follower) sensing is used, a further option is to verify even-numbered and odd-numbered word lines together (referred to as all word line erase-verify) or to verify the even-numbered and odd-numbered word lines separately (referred to as alternate word line erase-verify). Verifying the even-numbered and odd-numbered word lines separately may improve write-erase endurance.

Vsl can be set to a level which is lower than Vbl so that a current flows from the drain end to the source end of a NAND string. In one example, Vsl=1.2 V and the bit lines are held at Vbl=1.8 V. The current in each NAND string flows through the associated bit lines and is sensed at the associated sense amplifier. If the sensed current exceeds a threshold or trip level (Itrip), the NAND string is judged to be in a conductive state. If the sensed current does not exceed the trip level, the NAND string is judged to be in a non-conductive state. The value of Itrip is determined by a sensing time (tsense) which can be set based on a ROM fuse parameter in the memory device. In one approach, Isense is inversely proportional to tsense.

An erase-verify test is judged to be passed when all, or almost all of the NAND strings (except for a small number of NAND strings which might be ignored), are judged to be in a conductive state. The erase depth can be controlled by setting Vsl. A higher Vsl results in a deeper erased depth because it makes the erase-verify test stricter (more difficult to pass, requiring more erase loops). See FIGS. 13A-13C for further details.

The SGD line and SGS line receive voltages Vsgd and Vsgs, respectively, which render these transistors in a conductive state.

Even though the sensing can be done in a different manner for the negative all bit line sensing scheme and source follower sensing scheme, for both schemes, the judgment of whether the NAND string in conductive or non-conductive is determined by the amount of current flowing through the NAND string. The NAND string current is inversely proportional to the NAND string resistance. At each erase pulse, Verase is increased to erase the memory cells deeper, lowering their Vth and hence reducing the NAND string resistance. After a certain erase pulse, when the NAND string resistance reaches a sufficiently low value, the NAND string will be judged to be conductive, and the erase-verify test will be passed.

A current sensing device 1130 or 1131 can be used to measure a combined current through the NAND strings of the block. The current sensing device 1131 is connected to the source line (SL), which in turn is connected to the source end of each of the NAND strings. The current sensing device can regulate the level of Vsl using an operational amplifier, for instance. In one approach, Vsl is regulated to a positive voltage such as 0.5 V. Further, a pull up circuit can be used to increase Vsl when it falls below a specified level, while a pull down circuit can be used to decrease Vsl when it rises above the specified level. The current sensing device 1130 is connected to each of the bit lines. In one approach, the current sensing device 1130 includes a current mirror which mirrors the current of each bit line to provide the combined current in the block. The current sensing device can include an analog-to-digital converter to digitize a magnitude of the combined current which is detected.

Current can be measured directly or indirectly such as by observing a voltage or a change in a voltage.

FIG. 11B depicts current flow in NAND strings during a sensing process of even-numbered bit lines in connection with an erase-verify test. Another type of sensing is source-follower sensing (also referred to as even/odd sensing) in which the SL is charged up to Vdd (e.g., 2.5 V) and the bit lines to be sensed (even-numbered bit lines in this example) are initially grounded. The SGD transistors are biased high enough to make them conductive, so that the NAND string cell current can flow through them. In this technique, the even- and odd-numbered bit lines can be verified separately to avoid the effects from neighboring bit line coupling. When even-numbered bit lines are verified, the odd-numbered bit lines are held at Vdd, to avoid unwanted current flowing through the odd-numbered bit lines. Similarly, when odd-numbered bit lines are verified, the even-numbered bit lines are held at Vdd. NAND string current flows from the source side to the drain side of a NAND string as indicated by currents i_NS0 and i_NS2 for NS0 and NS2, respectively. During sensing, the bit lines to be sensed, are left floating and are charged up because of current following from the source side to the drain side of the NAND string. After waiting for a certain time, the final Vbl level to which the bit line is charged is judged by the sense amplifier. The NAND string is judged to be in a conductive state if Vbl>Vtrip, where Vtrip can be set based on a ROM fuse parameter in the memory device.

An erase-verify test is judged to be passed when all, or almost all of the NAND strings (except for a small number of NAND strings which might be ignored), are judged to be in a conductive state. The erase depth can be controlled by setting Vtrip. A higher trip voltage results in a deeper erased depth because it makes the erase-verify test stricter and difficult to pass. See FIGS. 14A and 14B for further details. Also, the erase depth can be controlled by setting Vsl. A lower Vsl results in a deeper erased depth because it makes the erase-verify test stricter.

The current sensing device 1130 or 1131 can be used to measure a combined current through the NAND strings of the block, as discussed.

FIG. 11C depicts current flow in NAND strings during a sensing process of odd-numbered bit lines in connection with an erase-verify test, which in one approach is performed after a sensing process of even-numbered bit lines. When odd-numbered bit lines are verified, the even-numbered bit lines are held at Vdd. NAND string current flows from the source side to the drain side of a NAND string as indicated by current i_NS1 for NS1. The current sensing device 1130 or 1131 can be used to measure a combined current through the NAND strings of the block, as discussed.

Figure 12:
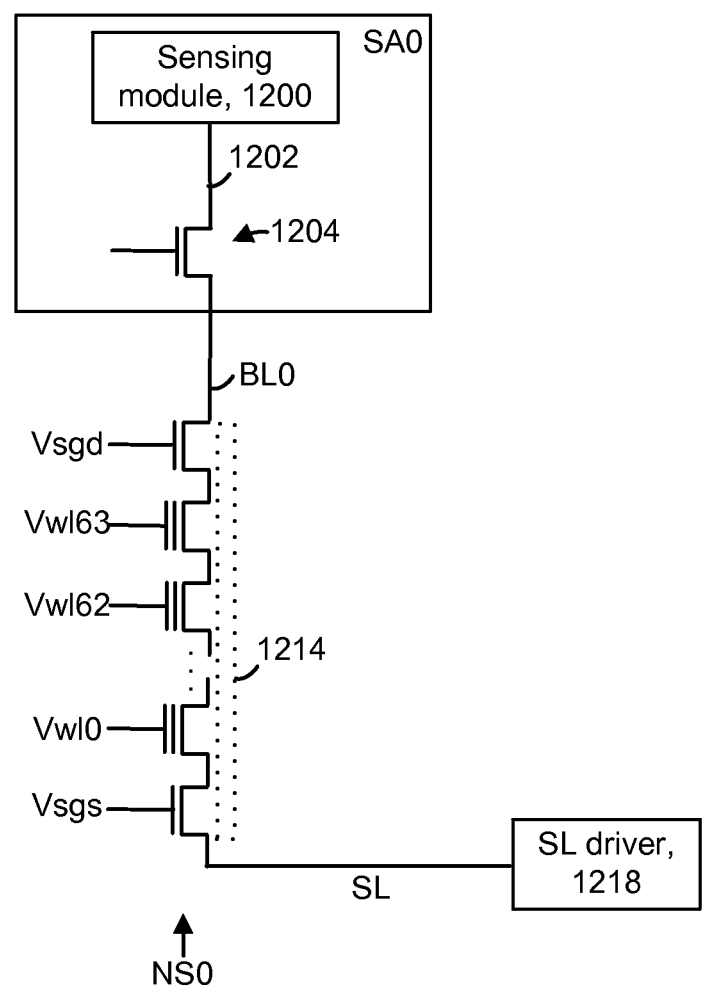
FIG. 12 depicts an example sensing circuit which includes the sense amplifier SA0 and NAND string NS0 of FIG. 3.

FIG. 12 depicts an example sensing circuit which includes the sense amplifier SA0 and NAND string NS0 of FIG. 3. NS0 includes a channel 1214 in the substrate, in the case of a 2D NAND device, or in a memory hole, in the case of a 3D NAND device. SA0 includes a sensing module 1200, a sense line 1202 and a transistor 1204 which is connected to BL0. A voltage on the bit line can be fixed or clamped to a desired level using the transistor 1204. A SL driver 1218 provides a voltage Vsl on the SL. In the all bit line sensing described in connection with FIG. 11A, the SL driver is used to set Vsl and the transistor 1204 is used to set Vbl. The transistor 1204 may be referred to as a bit line clamp (BLC) transistor. Depending on the conductive states of the memory cells in NS0, current may flow in the channel 1214 from the BL to the SL through the sense line. The sensing module can determine the amount of current (or at least, whether the current amount is below or above a certain current-trip level i.e., Itrip) on the sense line 1202 in different ways. In one possible approach, the sense module has a capacitor which is charged up. At t0, the capacitor is allowed to charge the sense line to a specified level. The voltage level is then determined to be above or below a trip voltage at a sense time. The current is determined to be above or below a trip current at the sense time according to whether the voltage level is below or above, respectively, the trip voltage. The sense module thus determines the current by pre-charging the sense line and subsequently determining a voltage drop which is tied to the current level. The sensing parameters can be adjusted by adjusting the pre-charge level or a trip level for the voltage drop.

FIG. 13A depicts a sensed current for the sensing scheme of FIG. 11A, where a current sense time is an adjustable parameter. During all bit line sensing, a current can flow in the NAND string starting at a time t0, when Vsl and Vbl are raised. A line 1300 represents a case where the NAND string is in a conductive state and a relatively large current flows. A line 1306 represents a case where the NAND string is in a non-conductive state and a relatively small current flows. At a sense time tsense0 or tsense1, line 1300 has a value at point 1302 (below a trip current Itrip) or 1304 (above Itrip), respectively. Thus, a relatively shorter sense time (tsense0) results in a determination that the NAND string is in a non-conductive state since I<Itrip, while a relatively longer sense time (tsense1) results in a determination that the NAND string is in a conductive state since I>Itrip.

FIG. 13B depicts a sensed current for the sensing scheme of FIG. 11A, where a current trip level is an adjustable parameter. The lines 1300 and 1306 are repeated. At a sense time tsense, line 1300 has a value at point 1308 which is above Itrip0 but below Itrip1. Thus, a relatively higher Itrip (Itrip1) results in a determination that the NAND string is in a non-conductive state, while a relatively lower Itrip (Itrip0) results in a determination that the NAND string is in a conductive state.

Figure 13C:
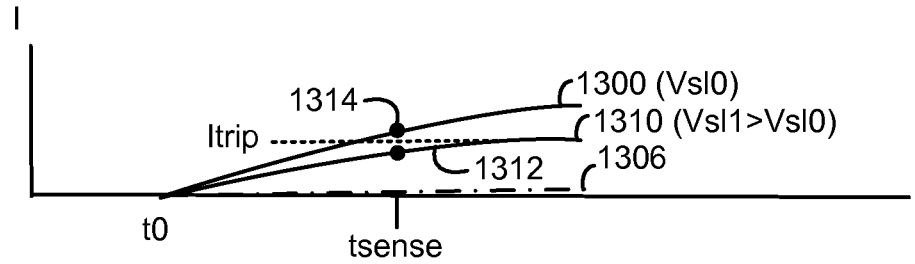
FIG. 13C depicts sensed currents for the sensing scheme of FIG. 11A, where a level of Vsl is an adjustable parameter, in accordance with step 836 of FIG. 8D.
Figure 14A:
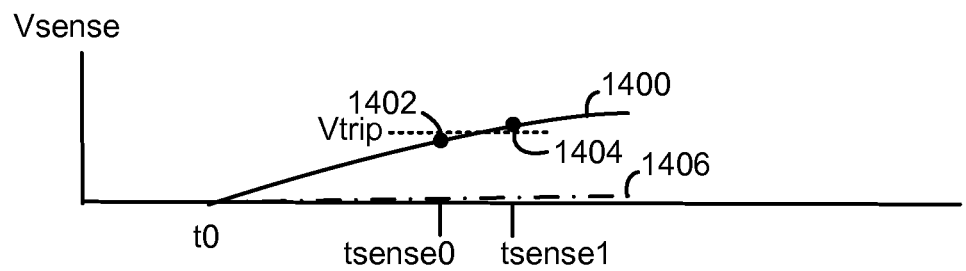
FIG. 14A depicts a sensed voltage for the sensing scheme of FIGS. 11B and 11C, where a voltage sense time is an adjustable parameter, in accordance with step 834 of FIG. 8D.
Figure 14B:
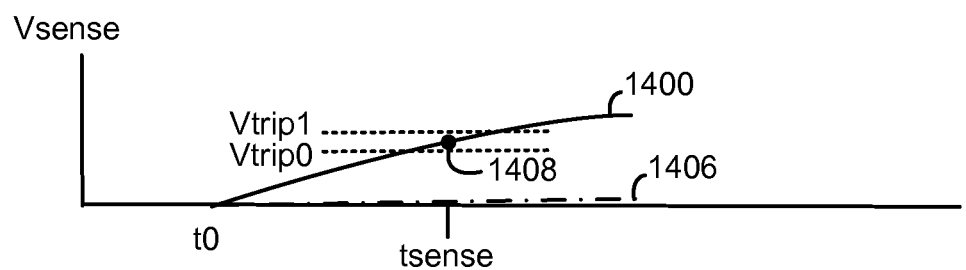
FIG. 14B depicts a sensed voltage for the sensing scheme of FIGS. 11B and 11C, where a voltage trip level is an adjustable parameter, in accordance with step 831 of FIG. 8D.

FIG. 13C depicts sensed currents for the sensing scheme of FIG. 11A, where a level of Vsl is an adjustable parameter. The lines 1300 and 1306 are repeated. Line 1300 represents a case where Vsl=Vsl0, and line 1310 represents a case where Vsl=Vsl1>Vsl0. At a sense time tsense, line 1300 has a value at point 1314 which is above Itrip and line 1310 has a value at point 1312 which is below Itrip. Thus, a relatively lower Vsl (Vsl0) results in a determination that the NAND string is in a conductive state, while a relatively higher Vsl (Vsl1) results in a determination that the NAND string is in a non-conductive state.

FIG. 14A depicts a sensed voltage for the sensing scheme of FIGS. 11B and 11C, where a voltage sense time is an adjustable parameter. During sensing of even- or odd-numbered bit lines, Vbl is sensed after Vsl is raised at t0. A line 1400 represents a case where the NAND string is in a conductive state and a relatively large voltage (Vbl) is sensed. A line 1406 represents a case where the NAND string is in a non-conductive state and a relatively small Vbl is sensed. At a sense time tsense0 or tsense1, line 1400 has a value at point 1402 (below a trip voltage Vtrip) or 1404 (above Vtrip), respectively. Thus, a relatively shorter sense time (tsense0) results in a determination that the NAND string is in a non-conductive state since Vsense<Vtrip, while a relatively longer sense time (tsense1) results in a determination that the NAND string is in a conductive state since Vsense>Vtrip.

FIG. 14B depicts a sensed voltage for the sensing scheme of FIGS. 11B and 11C, where a voltage trip level is an adjustable parameter. The lines 1400 and 1406 are repeated. At a sense time tsense, line 1400 has a value at point 1408 which is above Vtrip0 but below Vtrip 1. Thus, a relatively higher Vtrip (Vtrip1) results in a determination that the NAND string is in a non-conductive state, while a relatively lower Vtrip (Vtrip0) results in a determination that the NAND string is in a conductive state.

Figure 14C:
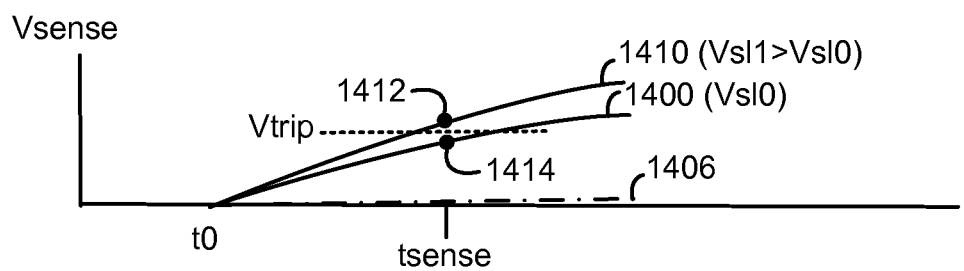
FIG. 14C depicts sensed voltages for the sensing scheme of FIGS. 11B and 11C, where a level of Vsl is an adjustable parameter, in accordance with step 836 of FIG. 8D.

FIG. 14C depicts sensed voltages for the sensing scheme of FIGS. 11B and 11C, where a level of Vsl is an adjustable parameter. The lines 1400 and 1406 are repeated. Line 1400 represents a case where Vsl=Vsl0, and line 1410 represents a case where Vsl=Vsl1>Vsl0. At a sense time tsense, line 1400 has a value at point 1414 which is below Vtrip and line 1410 has a value at point 1412 which is above Vtrip. Thus, a relatively lower Vsl (Vsl0) results in a determination that the NAND string is in a non-conductive state, while a relatively higher Vsl (Vsl1) results in a determination that the NAND string is in a conductive state.

Figure 15A:
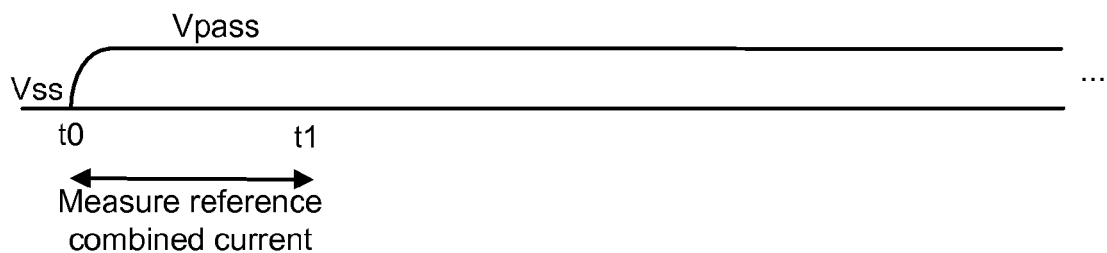
FIG. 15A depicts a voltage of unselected word lines during a process for measuring a reference combined current or an additional combined current in a set of NAND strings, in accordance with FIG. 8B.

FIG. 15A depicts a voltage of unselected word lines during a process for measuring a reference combined current or an additional combined current in a set of NAND strings, in accordance with FIG. 8B. The voltage can be increased from Vss (0 V) to Vpass at t0 and held at that level for the remainder of the process. From t0-t1, the reference combined current can be measured. At this time, all of the word lines in the block are unselected.

Figure 15B:
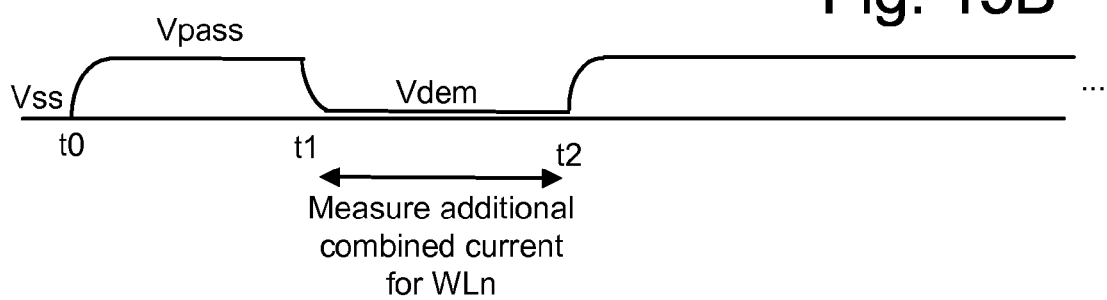
FIG. 15B depicts a voltage of a selected word line, WLn, during a process for measuring an additional combined current in a set of NAND strings, in accordance with step 814 of FIG. 8B.

FIG. 15B depicts a voltage of a selected word line, WLn, during a process for measuring an additional combined current in a set of NAND strings, in accordance with step 814 of FIG. 8B. At t1, one of the word lines (WLn) is selected. Vpass continues to be applied to the other, unselected word lines. From t1-t2, the additional combined current (Iadd) can be measured while Vdem is applied to the selected word line.

Figure 15C:
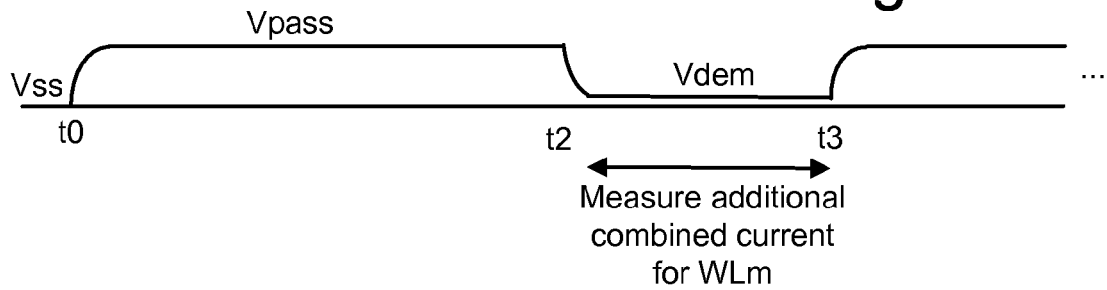
FIG. 15C depicts a voltage of another selected word line, WLm, during a process for measuring an additional combined current in a set of NAND strings, in accordance with step 814 of FIG. 8B.

FIG. 15C depicts a voltage of another selected word line, WLm, during a process for measuring an additional combined current in a set of NAND strings, in accordance with step 814 of FIG. 8B. At t2, another word line (WLm) is selected. Vpass continues to be applied to the other, unselected word lines. From t2-t3, the additional combined current (Iadd) can be measured while Vdem is applied to the selected word line. Additional voltages can be provided according to this pattern for each additional word line which is selected, until Nwl is determined.

As mentioned, word lines can be selected sequentially or non-sequentially. The change in the voltage of a selected word line can cause coupling to an adjacent word line. The approach of FIGS. 15A-15C reduces coupling by minimizing changes in the word line voltages since Vpass is maintained on the unselected word lines, and the word line voltage is lowered for one selected word line at a time. When a new word line is selected, the voltage of the previously selected word line increases from Vdem to Vpass. This results in coupling from only one word line. For comparison, another approach is to transition the unselected word lines from Vss to Vpass and back to Vss when each new word line is selected. Each transition from Vss to Vpass can result in coupling.

Moreover, coupling can be reduced further by selecting the word lines non-sequentially. For example, the selection order can be: WL0, WL31, WL1, WL32, . . . In this case, m≠n+1.

Note also that the amount of the combined current which is sensed can be fairly large since it includes current from each of the NAND strings. As a result, more noise can be tolerated compared to the case of sensing a single memory cell. Accordingly, the sensing process can be carried out relatively quickly. A shorter settling time can be used and a larger bit line displacement current can be tolerated. The noise margin is larger compared to typical word line sensing.

In one embodiment, a method for operating a non-volatile memory device includes: measuring a combined current through a plurality of NAND strings as a reference combined current while applying a read pass voltage (Vpass) to a plurality of word lines, the plurality of NAND strings comprise a plurality of memory cells and the plurality of word lines are connected to the plurality of memory cells; and identifying one or more selected word lines of the plurality of word lines which are programmed word lines, the identifying comprises, for each of the one or more selected word lines: measuring an additional combined current through the plurality of NAND strings while applying a demarcation voltage (Vdem) to the selected word line and applying the read pass voltage to remaining word lines of the plurality of word lines, and determining whether the additional combined current is less than the reference combined current by at least a margin.

In another embodiment, a non-volatile storage device comprises: a plurality of NAND strings, the plurality of NAND strings comprise a plurality of memory cells; a plurality of word lines connected to the plurality of memory cells; and a control circuit. The control circuit: measures a combined current through the plurality of NAND strings as a reference combined current while applying a read pass voltage to the plurality of word lines, and to identify one or more selected word lines of the plurality of word lines which are programmed word lines, for each of the one or more selected word lines: measures an additional combined current through the plurality of NAND strings while applying a demarcation voltage to the selected word line and applying the read pass voltage to remaining word lines of the plurality of word lines, and determines whether the additional combined current is less than the reference combined current by at least a margin.

In another embodiment, a method for operating a non-volatile memory device includes: receiving a command to perform an erase operation for a plurality of NAND strings, the plurality of NAND strings comprise a plurality of memory cells and a plurality of word lines are connected to the plurality of memory cells; and in response to the command: determining a number of word lines of the plurality of word lines which are programmed word lines, adjusting an erase-verify test of the erase operation to make the erase-verify test relatively hard to pass when the number is relatively small and to make the erase-verify test relatively easy to pass when the number is relatively large, and performing the erase operation using the erase-verify test.

Corresponding methods, systems and computer- or processor-readable storage devices which have executable code for performing the methods provided herein may also be provided.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A method for operating a non-volatile memory device, comprising:
    in response to a command to write data to a partially programmed block of memory cells, identifying one or more programmed word lines among a plurality of word lines of the block which are programmed according to a word line programming order, wherein the plurality of word lines are connected to a plurality of memory cells, and the plurality of memory cells are in a plurality of NAND strings; and
    based on the identifying of the one or more programmed word lines, identifying a word line among the plurality of word lines to begin programming the write data, wherein the identifying of the one or more programmed word lines comprises:
        measuring a combined current through the plurality of NAND strings as a reference combined current while applying a read pass voltage to the plurality of word lines, and
        evaluating each selected word line of a plurality of selected word lines of the plurality of word lines until an unprogrammed word line is identified, the evaluating each selected word line of the plurality of selected word lines comprises:
            measuring an additional combined current through the plurality of NAND strings while applying a demarcation voltage to the selected word line and applying the read pass voltage to remaining word lines of the plurality of word lines, and
            determining whether the additional combined current is less than the reference combined current by at least a margin.

2. The method of claim 1, wherein:
the plurality of selected word lines comprises a set of word lines which is adjacent to a source side of the block.

3. The method of claim 1, wherein:
the word line to begin programming the write data is the unprogrammed word line.

4. The method of claim 1, wherein:
the word line to begin programming the write data is a next word line in the word line programming order after a last programmed word line of one or more programmed word lines in the block.

5. The method of claim 1, wherein:
each selected word line is determined to be programmed if the additional combined current is less than the reference combined current by at least the margin, and unprogrammed if the additional combined current is not less than the reference combined current by at least the margin.

6. The method of claim 1, wherein:
the evaluating is performed for different selected word lines of the plurality of word lines until a number of programmed word lines in the block is determined.

7. The method of claim 1, wherein:
the evaluating is performed one selected word line at a time.

8. The method of claim 1, wherein:
the evaluating is performed for multiple selected word lines concurrently.

9. The method of claim 1, wherein:
the evaluating is performed according to the word line programming order.

10. The method of claim 1, wherein:
the evaluating is performed according to a sequential word line order.

11. The method of claim 1, wherein:
the evaluating is performed according to a non-sequential word line order.

12. The method of claim 1, wherein:
the evaluating is performed for one selected word line of the plurality of word lines followed directly by another selected word line of the plurality of word lines, where the one selected word line is separated from the another selected word line by at least one other word line.

13. The method of claim 1, wherein:
the read pass voltage is sufficiently high to cause the plurality of memory cells to be in a conductive state; and
the demarcation voltage is at a level which causes erased memory cells to be in a conductive state, and programmed memory cells to be in a non-conductive state.

14. A non-volatile memory device, comprising:
a plurality of NAND strings in a block, the plurality of NAND strings comprise a plurality of memory cells;
a plurality of word lines connected to the plurality of memory cells; and
a control circuit, the control circuit is configured to:
    in response to a command to write data to the block, make an identification of one or more programmed word lines among the plurality of word lines of the block which are programmed according to a word line programming order; and
    based on the identification of the one or more programmed word lines, identify a word line among the plurality of word lines to begin programming the write data, wherein the control circuit, to make the identification of the one or more programmed word lines, is configured to:
        measure a combined current through the plurality of NAND strings as a reference combined current while a read pass voltage is applied to the plurality of word lines, and
        evaluate each selected word line of a plurality of selected word lines of the plurality of word lines until an unprogrammed word line is identified, wherein the control circuit, to evaluate each selected word line of the plurality of selected word lines, is configured to:
measure an additional combined current through the plurality of NAND strings while a demarcation voltage is applied to the selected word line and the read pass voltage is applied to remaining word lines of the plurality of word lines, and
determine whether the additional combined current is less than the reference combined current by at least a margin.

15. The non-volatile memory device of claim 14, further comprising:
a common source line, the plurality of NAND strings are connected to the common source line; and
a current sensing device connected to the source line, wherein the control circuit is configured to measure the reference combined current and the additional combined current using the current sensing device.

16. The non-volatile memory device of claim 14, further comprising:
a plurality of bit lines, the plurality of NAND strings are connected to the plurality of bit lines; and
a current sensing device connected to the plurality of bit lines, wherein the control circuit is configured to measure the reference combined current and the additional combined current using the current sensing device.

17. The non-volatile memory device of claim 14, wherein:
the evaluating is performed for different selected word lines of the plurality of word lines until a number of programmed word lines in the block is determined.

18. The non-volatile memory device of claim 14, wherein:
for each of the plurality of selected word lines which is a programmed word line, the selected word line is also connected to erased memory cells.

19. The non-volatile memory device of claim 14, wherein:
the read pass voltage is sufficiently high to cause the plurality of memory cells to be in a conductive state; and
the demarcation voltage is at a level which causes erased memory cells to be in a conductive state, and programmed memory cells to be in a non-conductive state.

20. The non-volatile memory device of claim 14, wherein:
the evaluating is performed according to a non-sequential word line order.

* * * * *